United States Patent
Daniel et al.

(10) Patent No.: US 8,402,653 B2
(45) Date of Patent: Mar. 26, 2013

(54) SOLAR ENERGY CONVERTER ASSEMBLY INCORPORATING DISPLAY SYSTEM AND METHOD OF FABRICATING THE SAME

(75) Inventors: Jurgen H. Daniel, San Francisco, CA (US); David K. Fork, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 712 days.

(21) Appl. No.: 12/533,989

(22) Filed: Jul. 31, 2009

(65) Prior Publication Data

US 2011/0023282 A1 Feb. 3, 2011

(51) Int. Cl.
*B23P 15/26* (2006.01)
*H01L 31/042* (2006.01)

(52) U.S. Cl. ....... 29/890.033; 29/428; 29/458; 136/246; 320/101

(58) Field of Classification Search ............. 29/890.033, 29/428, 458; 320/101, 107; 323/906; 136/243, 136/246; 126/569
See application file for complete search history.

(56) References Cited

U.S. PATENT DOCUMENTS

| | | | | |
|---|---|---|---|---|
| 3,232,795 A * | 2/1966 | Snyder et al. | ................ | 136/246 |
| 3,739,182 A * | 6/1973 | Bickler | ................ | 250/569 |
| 4,007,728 A * | 2/1977 | Guba | ................ | 126/667 |
| 4,204,881 A * | 5/1980 | McGrew | ................ | 136/246 |
| 6,015,950 A * | 1/2000 | Converse | ................ | 136/246 |
| 6,023,866 A | 2/2000 | Polsky | | |
| 6,177,627 B1 * | 1/2001 | Murphy et al. | ................ | 136/246 |
| 6,528,716 B2 * | 3/2003 | Collette et al. | ................ | 136/246 |
| 6,957,650 B2 * | 10/2005 | Nyhart et al. | ................ | 126/600 |
| 7,124,893 B2 | 10/2006 | Winckels | | |
| 7,164,839 B2 * | 1/2007 | Nyhart et al. | ................ | 385/131 |
| 7,206,142 B1 * | 4/2007 | Wagner | ................ | 359/742 |
| 7,301,095 B2 * | 11/2007 | Murphy et al. | ................ | 136/246 |
| 7,321,095 B2 * | 1/2008 | Boulanger et al. | ................ | 136/246 |
| 7,368,656 B2 * | 5/2008 | Boulanger | ................ | 136/246 |
| 7,369,735 B2 * | 5/2008 | Nyhart, Jr. | ................ | 385/131 |
| 7,606,456 B2 * | 10/2009 | Nyhart, Jr. | ................ | 385/131 |
| 7,772,800 B2 * | 8/2010 | Roozeboom et al. | ................ | 320/107 |
| 8,088,475 B2 * | 1/2012 | Sasaki et al. | ................ | 428/304.4 |
| 2003/0000567 A1 * | 1/2003 | Lynn | ................ | 136/246 |
| 2004/0187906 A1 * | 9/2004 | Boulanger et al. | ................ | 136/244 |
| 2009/0183764 A1 * | 7/2009 | Meyer | ................ | 136/246 |
| 2009/0230915 A1 * | 9/2009 | Roozeboom et al. | ................ | 320/101 |
| 2010/0282241 A1 * | 11/2010 | Massen | ................ | 126/569 |
| 2011/0023937 A1 * | 2/2011 | Daniel et al. | ................ | 136/246 |
| 2011/0094565 A1 * | 4/2011 | Banin et al. | ................ | 136/246 |
| 2011/0265855 A1 * | 11/2011 | Baruchi et al. | ................ | 136/246 |
| 2011/0277750 A1 * | 11/2011 | Peguero | ................ | 126/675 |
| 2011/0308514 A1 * | 12/2011 | Cafri | ................ | 126/674 |

FOREIGN PATENT DOCUMENTS

JP 2010245464 A * 10/2010

* cited by examiner

*Primary Examiner* — Essama Omgba
(74) *Attorney, Agent, or Firm* — Marger Johnson & McCollom PC

(57) ABSTRACT

According to one embodiment, a method of forming a solar energy converter assembly disclosed herein includes providing a solar energy converter configured to convert light incident on a light-receiving surface thereof into another form of energy and providing louver elements adjacent to the light-receiving surface such that light is transmittable between the louver elements to the light-receiving surface along a plurality of directions. Display surfaces of the louver elements are visible along a predetermined direction different from the plurality of directions and non-display surfaces of the louver elements reflect light to the light-receiving surface.

18 Claims, 13 Drawing Sheets

SOLAR ENERGY CONVERTER ASSEMBLY INCORPORATING DISPLAY SYSTEM AND METHOD OF FABRICATING THE SAME

RELATED APPLICATION DATA

This application is related to co-pending U.S. patent application Ser. No. 12/533,968, titled "SOLAR ENERGY CONVERTER ASSEMBLY INCORPORATING DISPLAY SYSTEM AND METHOD OF FABRICATING THE SAME", filed Jul. 31, 2009, which is herein incorporated by reference for all purposes.

TECHNICAL FIELD

The presently-disclosed embodiments are directed to solar energy converter assemblies incorporating display systems and methods of fabricating the same.

BACKGROUND

Many types of photovoltaic installations undesirably change the aesthetics of a building due to their bluish/silver appearance. This aesthetic change is very apparent when photovoltaic cell arrays are installed on certain roofs (e.g., red tile roofs) of buildings. Attempts have been made to change the color of the photovoltaic cell arrays by applying coatings such as colored thin-film coatings (see, e.g., N. Ishikawa et al., First WCPEC, Dec. 5-9, 1994, p. 977) or by using semi-transparent modules. Also, pure black or dark blue photovoltaic cells are often preferred for residential installations due to their dark and relatively uniform appearance. Similar aesthetic drawbacks are also observed when using other devices such as thermoelectric units and solar thermal units. However, alternative and adaptive solutions to prevent solar energy converters (e.g., photovoltaic cell arrays, thermoelectric units, solar thermal units, etc.) from undesirably detracting from a building's appearance are still being sought.

DETAILED DESCRIPTION OF THE EMBODIMENTS

Figure 1:
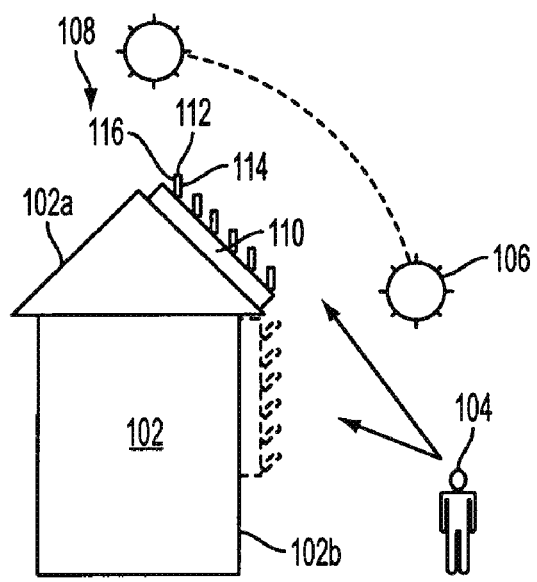
FIG. 1 schematically illustrates an environment in which a solar energy converter assembly according to some embodiments is disposed.

Shown in FIG. 1 is a structure (e.g., a building) 102, an observer 104, a light source (i.e., the sun) 106, and a solar energy converter assembly 108 supported by the structure 102. In one embodiment, the solar energy converter assembly 108 may be obliquely mounted to the structure 102 (e.g., on a roof 102a of the building). In another embodiment, the solar energy converter assembly 108 may be vertically mounted to the structure 102 (e.g., on a wall 102b of the building, as shown by dashed lines). Although FIG. 1 illustrates the structure 102 as a building having an inclined roof 102a, it will be appreciated that the structure 102 may be a building having a horizontal roof to which the solar energy converter assembly 108 could be horizontally mounted. Although FIG. 1 illustrates the structure 102 supporting the solar energy converter assembly 108 as a building, it will be appreciated that the structure 102 may be provided as any structure suitable for supporting the solar energy converter assembly 108 (e.g., a fixed or moveable frame coupled to, or standing apart, from a building). For example, the structure may be provided as a vehicle (e.g., a car), clothing (e.g. a coat or jacket), a bag, a blanket, or any other structure. Generally, the solar energy converter assembly 108 can be characterized as including a solar energy converter 110 and a display system adjacent to the solar energy converter 110. In one embodiment, the solar energy converter assembly 108 may also include one or more light sensors.

As used herein, a "solar energy converter" refers to any device configured to convert solar energy (e.g., light, heat, or the like or a combination thereof), which is incident on a light-receiving surface thereof (e.g., any surface that is exposed to solar energy) into other forms of energy such as electricity, heat, or the like or a combination thereof. Exemplary solar energy converters that may be included within a solar energy converter assembly include photovoltaic cell arrays (e.g., including one or more photovoltaic cells), thermoelectric units, solar thermal units, or the like or a combination thereof. For the discussion purposes only, a solar energy converter assembly 108 will be herein described as a "photovoltaic assembly" in which a photovoltaic cell array is provided as the solar energy converter. It will be appreciated that any of the embodiments discussed below may be readily applied to solar energy converter assemblies in which other solar energy converters (e.g., thermoelectric units, solar thermal units, or the like or a combination thereof) are used instead of, or in addition to, photovoltaic cell arrays.

A photovoltaic cell array 110 includes one or more photovoltaic cells and is configured to generate electricity when light is incident on a light-receiving surface thereof. Thus, light-receiving surface of the photovoltaic cell array 110 is constituted by the light-receiving surface of each photovoltaic cell included in the photovoltaic cell array 110. Each photovoltaic cell may be provided as a crystalline photovoltaic cell, a thin film photovoltaic cell, or the like or a combination thereof. Exemplary photovoltaic cells include crystalline or polycrystalline silicon photovoltaic cells, III-V semiconductor-based photovoltaic cells, amorphous silicon-based photovoltaic cells, cadmium telluride-based photovoltaic cells, chalcogenide-based photovoltaic cells (e.g., copper-indium-gallium-diselenide-based photovoltaic cells), organic photovoltaic cells, dye-sensitized photovoltaic cells, or the like or a combination thereof. The display system includes louver elements 112 that are adjacent to the light-receiving surface of the photovoltaic cell array 110. The display system and photovoltaic cell array 110 are arranged in such a way that the observer 104 views the display system while light from the sun 106 is irradiated onto the light-receiving surface of the photovoltaic cell array 110. Thus, visual function of the photovoltaic assembly 108 (i.e., the appearance of the photovoltaic assembly 108 to the observer 104) can be separated from the electrical function of the photovoltaic assembly 108 (i.e., the generation of energy). Apart from improving the aesthetic appearance of the photovoltaic cell array 110 to an observer, the display system may also camouflage the photovoltaic cell array 110 in order to make a photovoltaic assembly blend into the environment (e.g. for military applications).

Each of the louver elements 112 includes a display surface 114 and a non-display surface 116 opposite the display surface 114. The louver elements 112 are spaced apart from one another and extend along the same or substantially the same direction. In one embodiment, the louver elements 112 also protrude (or are configured to protrude) a predetermined distance away from the light-receiving surface of the photovoltaic cell array 110. Thus, light from the sun 106 can be transmitted to the light-receiving surface of the photovoltaic cell array 110 between adjacent ones of the louver elements 112. Parameters influencing the configuration of the display system (e.g., the distance between adjacent louver elements 112, the distance to which the louver elements 112 protrude from the light-receiving surface of the photovoltaic cell array 110, the orientation of the louver elements 112 relative to the light-receiving surface of the photovoltaic cell array 110, etc.) may be selected based on the desired appearance of the display system, the type of photovoltaic cell array 110 used, cost of the display system, the method by which the display system is manufactured, and the amount of light desired to be transmitted to the light-receiving surface of the photovoltaic cell array 110. Accordingly, display system may be configured to balance the aesthetic appearance of the photovoltaic assembly 108 with the energy-generating function of the photovoltaic assembly 108 (e.g., by allowing light to be transmitted between the louver elements 112 to the light-receiving surface of the photovoltaic cell array 110 along a plurality of transmission directions). Generally, transmission directions correspond to locations where the sun 106 can be found in the sky during a predetermined period, relative to the photovoltaic cell array 110.

It will be appreciated that the aforementioned parameters influencing the configuration of the display system are not necessary independent of one another. For example, the distance to which the louver elements 112 protrude from the light-receiving surface of the photovoltaic cell array 110 (i.e., the height of the louver elements 112) may range from sub-millimeter length to several centimeters. As the height of the louver elements 112 increases, the distance between adjacent louver elements 112 typically increases. The orientation of the orientation of the louver elements 112 relative to the light-receiving surface of the photovoltaic cell array 110 may range from being perpendicular to the light-receiving surface of the photovoltaic cell array 110 to varying degrees of being obliquely inclined depending on, for example, the height of the louver elements 112 and the distance between adjacent ones of the louver elements 112. In one embodiment, the height of the louver elements 112 may be about 1 mm, adjacent ones of the louver elements 112 may be spaced apart from each other by about 2 mm, and the orientation of the louver elements 112 relative to the light-receiving surface of the photovoltaic cell array 110 may be about 45 degrees. In another embodiment, the height of the louver elements 112 may be about 6 mm, adjacent ones of the louver elements 112 may be spaced apart from each other by about 9 mm, and the orientation of the louver elements 112 relative to the light-receiving surface of the photovoltaic cell array 110 may be about 90 degrees. It will be appreciated that the aforementioned parameter values are merely illustrative and may be adjusted as desired.

In one embodiment, each of the louver elements 112 is provided as a single material layer providing both the display surface 114 and the non-display surface 116. The single material layer may include an opaque material (e.g., an opaque metal, an opaque polymer, an opaque ceramic (including glass), etc.), a translucent material (e.g., a translucent polymer, a translucent ceramic (including glass), etc.) or a transparent material (e.g., a transparent polymer, a transparent ceramic (including glass), etc.). The opaque, translucent and transparent materials may be provided as a generally homogenous material or as a composite material formed of two or more constituent materials. Thus, the display surface 114 and the non-display surface 116 of at least one of the louver elements 112 may be opaque, translucent or transparent.

As described above, each of the louver elements 112 may be provided as a single material layer providing both the display surface 114 and the non-display surface 116. In another embodiment, however, each of the louver elements 112 may be provided as a composite material layer including one or more opaque materials, one or more translucent materials, one or more transparent materials, or a combination thereof. Examples exemplary composite material layers will be described below with respect to FIGS. 2A-2C.

Figures 2A, 2B, 2C:
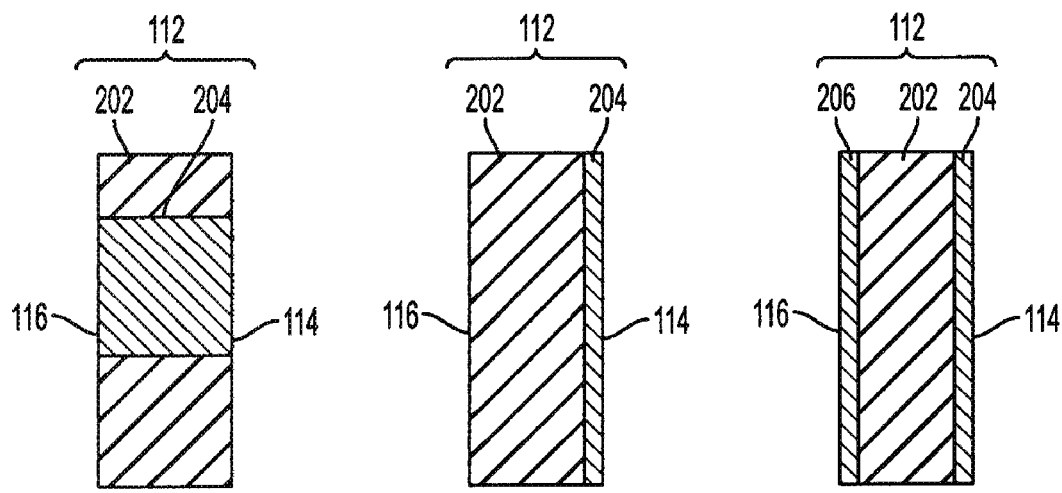
FIGS. 2A-2C illustrate cross-sectional views of a louver element shown in FIG. 1, according to some embodiments, FIG. 3 schematically illustrates an example of a coherent image provided by display surfaces of the louver elements shown in FIG. 1, according to one embodiment.

Referring to FIG. 2A, each louver element 112 may be provided as a composite material layer including a first material 202 and a second material 204 configured in such a manner that both the first material 202 and the second material 204 provide the display surface 114 and the non-display surface 116. Any of the first material 202 and the second material 204 may be provided as an opaque, translucent or transparent material, but characteristics of the first material 202 (e.g., including light transmission, light absorption, light emission, light reflectance, apparent color, or the like or a combination thereof) may be different from corresponding characteristics of the second material 204. The first material 202 and the second material 204 in the composite material layer shown in FIG. 2A may be formed by any suitable technique such as molding one material over another, co-extruding one material with another, printing (e.g. screen printing, inkjet printing, flexographic printing, gravure printing, or the like or a combination thereof) one material on another, laminating one material on another, or the like or a combination thereof. It will be appreciated that one or more additional materials may be included within the composite material layer shown in FIG. 2A. Thus, the display surface 114 and the non-display surface 116 of at least one of the louver elements 112 may include at least one opaque region, at least one translucent region, at least one transparent region or a combination thereof.

Referring to FIG. 2B, in one embodiment, each louver element 112 may be provided as a composite material layer in which the aforementioned second material 204 provides the display surface 114 and the aforementioned first material 202 provides the non-display surface 116. Thus, the display surface 114 and/or the non-display surface 116 of at least one of the louver elements 112 may be opaque, translucent or transparent. In another embodiment, both the first material 202 and the second material 204 may provide the display surface 114. Thus, the display surface 114 of at least one of the louver elements 112 may include at least one opaque region, at least one translucent region, at least one transparent region or a combination thereof. The first material 202 and the second material 204 in the composite material layer shown in FIG. 2B may be formed by any suitable technique such as molding one material next to another, coextruding one material with another, printing one material next to another, laminating one material onto another, painting or spraying one material onto another or the like or a combination thereof. It will be appreciated that one or more additional materials may be included within the composite material layer shown in FIG. 2B, e.g., in the manner described above with respect to FIG. 2A.

Referring to FIG. 2C, in one embodiment, each louver element 112 may be provided as a composite material layer in which the aforementioned second material 204 provides the display surface 114 and a third material 206 provides the non-display surface 116. The third material 206 may be provided as an opaque, translucent or transparent material, but characteristics of the third material 206 (e.g., including light transmission, light absorption, light emission, light reflectance, apparent color, or the like or a combination thereof) may be different from corresponding characteristics of the first material 202 and be the same as or different from corresponding characteristics of the second material 204. Thus, the display surface 114 and/or the non-display surface 116 of at least one of the louver elements 112 may be opaque, translucent or transparent. In one embodiment, both the first material 202 and the second material 204 may provide the display surface 114 as similarly described above with respect to FIG. 213. In another embodiment, both the first material 202 and the third material 206 may provide the non-display surface 116. Thus, the display surface 114 and the non-display surface 116 of at least one of the louver elements 112 may include at least one opaque region, at least one translucent region, at least one transparent region or a combination thereof. The first material 202, the second material 204 and the third material 206 in the composite material layer shown in FIG. 2C may be formed by any suitable technique such as molding one material next to another, co-extruding one material with another, printing one material next to another, laminating one material onto another, painting or spraying one material onto another or the like or a combination thereof. In another embodiment, the second material 204. Thus, the non-display surface 116 of at least one of the louver elements 112 includes at least one opaque region, at least one translucent region, at least one transparent region or a combination thereof. It will be appreciated that one or more additional materials may be included within the composite material layer shown in FIG. 2C, e.g., in the manner described above with respect to FIG. 2A.

According to some embodiments, at least one of the first material 202, the second material 204 and the third material 206 described with respect to any of FIGS. 2A-2C may be provided as a luminescent material (e.g., a phosphorescent material, a fluorescent material, an electroluminescent material, or the like or a combination thereof) such that at least a portion of the display surface 114 and/or the non-display surface 116 is a light-emissive surface. As used herein, a surface is "light-emissive" when the surface emits light so that it is visible to the observer 104 without the presence of visible ambient light. In another embodiment, at least one of the louver elements 112 includes a light-emitting device (e.g., an incandescent light source, a fluorescent light source, a light-emitting diode, a flat electroluminescent sheet, etc.) which is configured to provide at least a portion of the display surface 114 and/or the non-display surface 116 as a light-emissive surface. In embodiments where the luminescent material is an electroluminescent material (or where the louver elements 112 includes a light-emitting device), a power source (not shown) may be coupled to the louver elements 112 to cause the display surface 114 and/or the non-display surface 116 to emit light. A wired or wireless controller (not shown) may further be coupled to the power source to control emission of light. Providing at least a portion of the display surface 114 a louver element 112 as a light-emissive surface may enhance the visibility of the display surface 114 in low ambient lighting conditions. Providing at least a portion of the non-display surface 116 of a louver element 112 as a light-emissive surface may enhance the ability of the photovoltaic cell array 110 to generate electricity in low ambient lighting conditions. For example, if the non-display surface 116 includes a phosphorescent material, then the ability of the photovoltaic cell array 110 to generate electricity during a low-light situation may be extended.

According to some embodiments, at least one of the first material 202, the second material 204 and the third material 206 described with respect to any of FIGS. 2A-2C may be provided as a reflective material (e.g., providing a Lambertian-reflecting surface, a specular-reflecting surface, a retro-reflecting surface, or the like or a combination thereof) such that at least a portion of the display surface 114 and/or the non-display surface 116 is a light-reflective surface. For example, in embodiments where at least a portion of the display surface 114 and/or the non-display surface 116 provides a Lambertian-reflecting surface, at least one of the first material 202, the second material 204 and the third material 206 may include a layer having a white surface (e.g., made of titanium dioxide particles). In one embodiment, the first material 202 shown in FIG. 2B is glass or plexiglass and the second material 204 shown in FIG. 2B is a double layer of Krylon 2320 Fusion for Plastic gloss white paint (e.g., sprayed onto the first material 202) and Krylon 2328 Fusion for Plastic Pepper Red paint (e.g., sprayed onto the gloss white paint). In embodiments where at least a portion of the display surface 114 and/or the non-display surface 116 provides a specular-reflecting surface, at least one of the first material 202, the second material 204 and the third material 206 may, for example, include an aluminum layer. As used herein, a surface is "light-reflective" when the surface requires at least some ambient lighting to be visible to the observer 104. Providing at least a portion of the display surface 114 of a louver element 112 as a light-reflective surface may enhance the visibility of the display surfaces 114 in ambient lighting conditions. Providing at least a portion of the non-display surface 116 of a louver element 112 as a light-reflective surface may enhance the ability of the photovoltaic cell array 110 to generate electricity in ambient lighting conditions. Coatings, films or materials with high light reflectivity are here particularly useful and in one example, a coating with a light reflectivity above 60% white reflectivity may be chosen.

When the louver elements 112 are configured as described above, display surfaces 114 of the louver elements 112 are visible along a predetermined direction (i.e., a viewing direction) different from the transmission directions. Because the photovoltaic cell array 110 is supported by the structure 102, the photovoltaic cell array 110 is disposed at a predetermined (i.e., reference) location. Accordingly, the louver elements 112 are configured to obstruct a view of the photovoltaic cell array 110 when viewed from a predetermined location relative to the reference location. As shown in FIG. 1, the predetermined location relative to the reference location corresponds to the location of the observer 104 relative to the location of the photovoltaic cell array 110.

Figure 3:
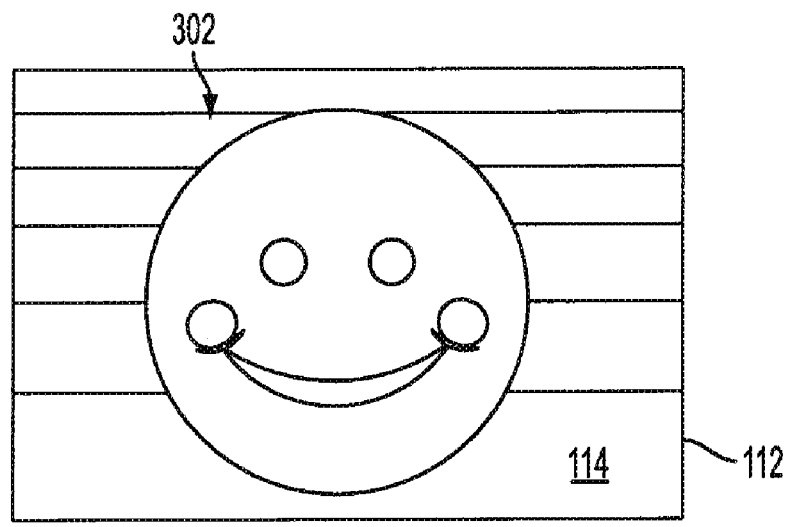

Configured as described above, the louver elements 112 may provide an image. In one embodiment, the image may correspond to an appearance of a surface supporting the photovoltaic cell array 110. For example, in the embodiment shown in FIG. 1, a photovoltaic cell array 110 may be supported on a surface of the roof 102a of the structure (i.e., building) 102. In such an embodiment, the image provided correspond to the appearance of the roof 102a (e.g., in terms of color, shapes of shingles, or the like or a combination thereof). In another embodiment, the image may include a picture, text, or the like or a combination thereof. In one embodiment, the image provided by the louver elements 112 may be coherent (or substantially coherent) when viewed at one or more predetermined locations relative to the photovoltaic cell array 110. One example of a coherent image is identified at 302 in FIG. 3. In another embodiment, the coherent image may correspond to an appearance of the surface supporting the photovoltaic cell array 110 and also include a picture, text, or the like or a combination thereof. In another embodiment, the image may correspond to an environment surrounding the photovoltaic cell array 110 (e.g., grass, rocks, etc.). Accordingly, in some embodiments, the image provided by the louver elements 112 may help to camouflage the photovoltaic cell array 110.

As described above, the louver elements 112 are configured to provide a coherent image that is static (i.e., unchanging when viewed at the predetermined location relative to the reference location of the photovoltaic cell array 110). In another embodiment, however, at least one of the louver elements 112 may be configured to provide a coherent image that is dynamic (i.e., that is capable of changing when viewed at the predetermined location relative to the reference location of the photovoltaic cell array 110). In such an embodiment, at least one louver element 112 may include a display device, which provides at least a portion of the display surface 114. The display device may be laminated or printed directly onto the louver element 112. Within the display device, the display may be directly addressed or matrix-addressed. The display device may be coupled to a power source (not shown) and be driven by a wired or wireless controller (not shown). The display device may include an emissive digital display device, a reflective digital display device, or the like or a combination thereof. Examples of emissive digital display devices that may be provided as the display device include, for example, light emitting diode (LED) panels, organic light emitting diode (OLED) panels, electroluminescent displays, back-lit liquid crystal display (LCD) panels, polymer dispersed LCDs (e.g., from Pelikon, Ltd. of Cambridge, UK), or the like or a combination thereof. Examples of reflective digital display devices that may be provided as the display device include, for example, reflective LCDs, electrophoretic displays (e.g., frp, E Ink Corporation of Cambridge, Mass.), electrochromic displays, interference-based displays, powder displays or the like or a combination thereof.

As described above, the louver elements 112 are configured to provide a coherent image when viewed at the predetermined location relative to the reference location of the photovoltaic cell array 110. In another embodiment, however, at least some of the louver elements 112 may be configured to provide an incoherent image when viewed by the observer 104. As used herein, an "incoherent image" is provided when at least a portion of the photovoltaic cell array 110 is visible between adjacent ones of the louver elements 112.

Figure 4A:
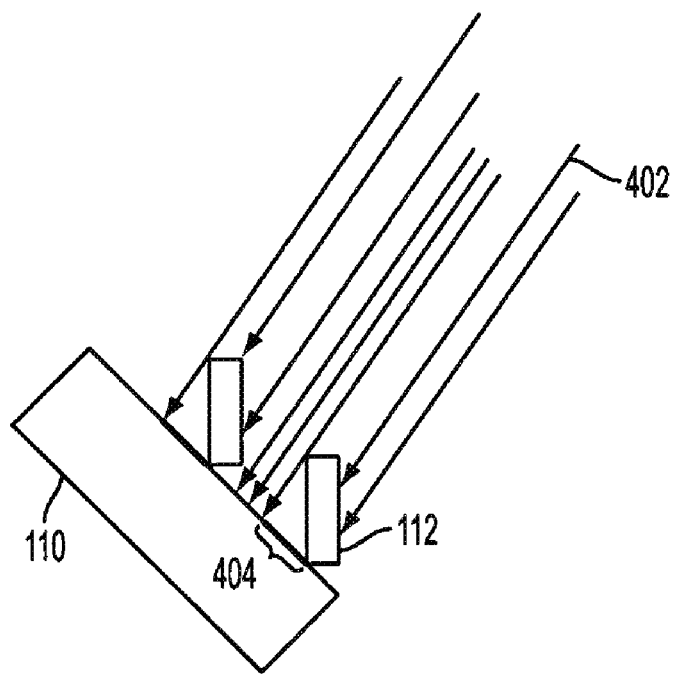
FIG. 4A schematically illustrates the influence of louver elements on light transmitted toward the solar energy converter shown in FIG. 1, according to one embodiment.
Figure 4B:
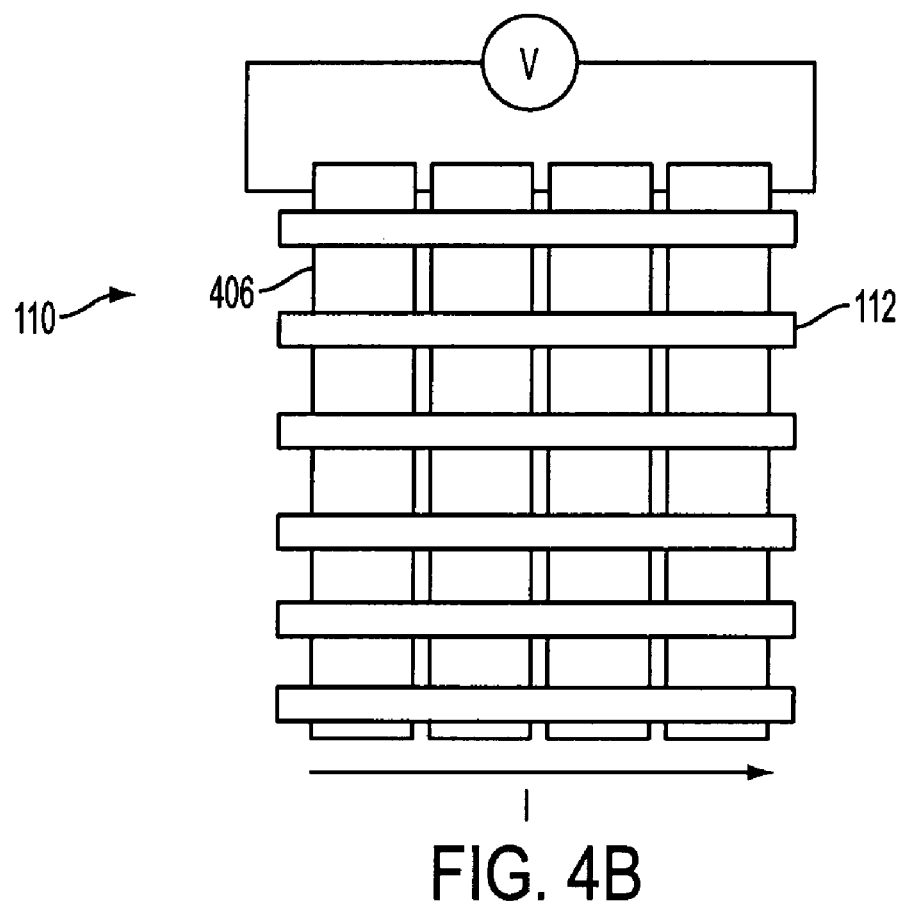
FIG. 4B schematically illustrates a top plan view of an arrangement of louver elements over a solar energy converter provided as a photovoltaic cell array including a plurality of photovoltaic cells, according to one embodiment.

FIG. 4A schematically illustrates the influence of louver elements on light transmitted toward a photovoltaic cell array of the photovoltaic assembly shown in FIG. 1. FIG. 4B schematically illustrates an arrangement of louver elements over a photovoltaic cell array including a plurality of photovoltaic cells, according to one embodiment.

In one embodiment, one or more of the louver elements 112 may absorb or reflect light incident to the photovoltaic assembly 108 along at least one of the plurality of transmission directions. Accordingly, and as shown in FIG. 4A, one or more louver elements 112 may absorb or reflect some light 402 transmitted from the sun 106 along at least one of the plurality of transmission directions, thereby casting a shadow(s) 404 on the light-receiving surface of the photovoltaic cell array 110. Thus, the amount of light 402 incident on the light-receiving surface of the photovoltaic cell array 110 may be less than the total amount of light transmitted from the sun 106. Therefore, in embodiments where the photovoltaic cell array 110 includes a plurality of photovoltaic cells 406 connected in such a manner as to generate a current flow, I, along the direction indicated by the arrow, the louver elements 112 extend along a direction generally parallel to the direction of current flow.

Having generally described a photovoltaic assembly according to various embodiments above with respect to FIGS. 1-4, exemplary embodiments of display systems that may be incorporated within the photovoltaic assembly 108 will now be described below.

Figure 5A:
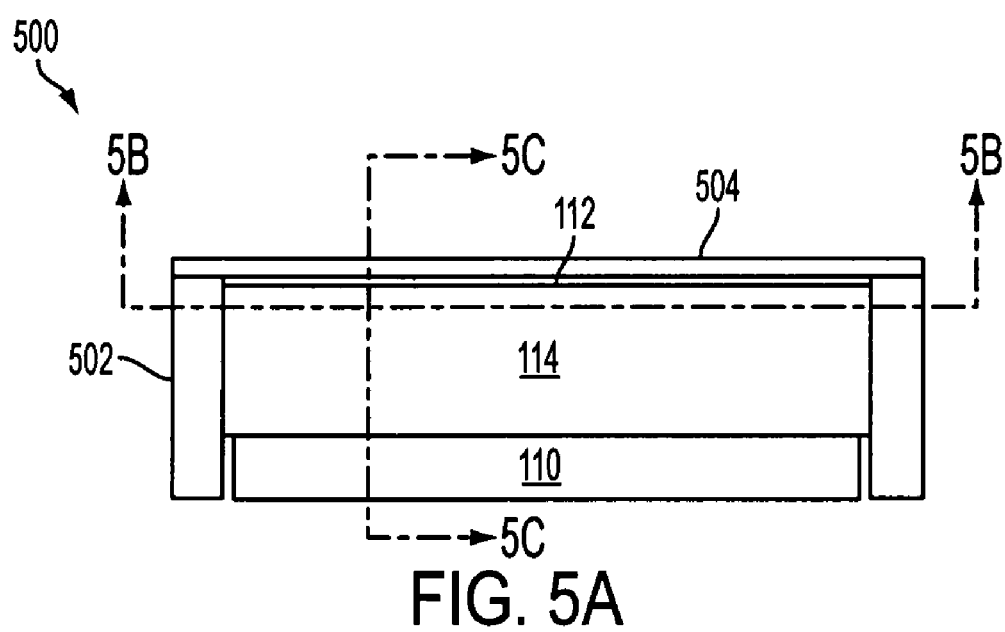
FIGS. 5A-5C illustrate various views of a photovoltaic assembly according to a first embodiment.
Figure 5B:
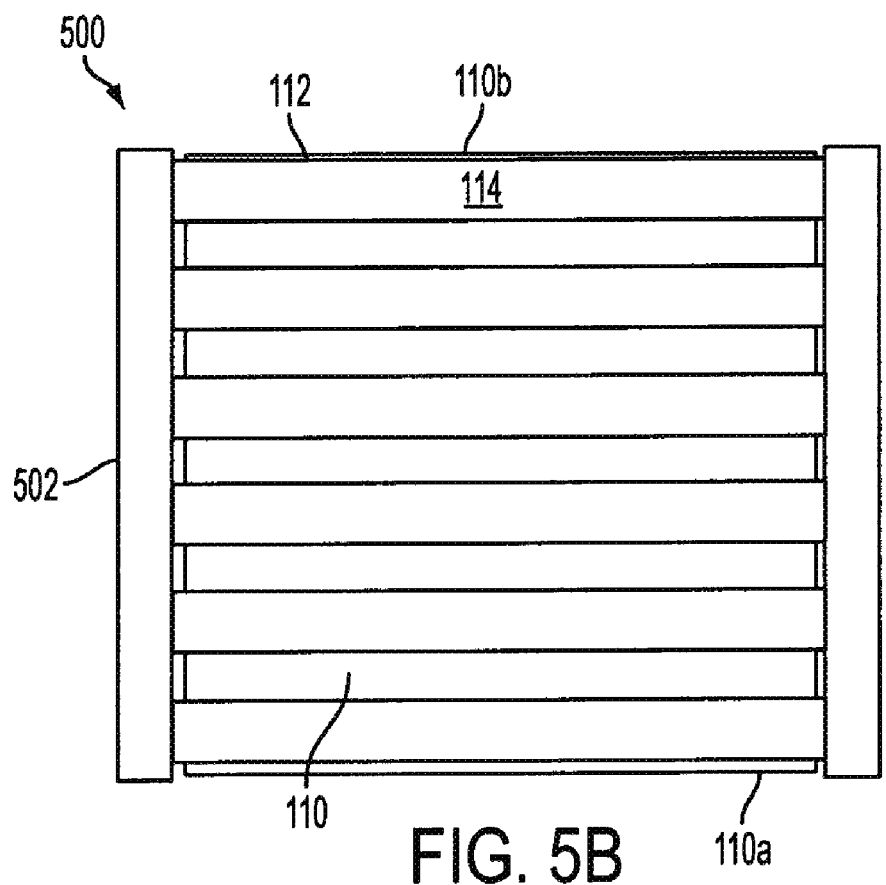
Figure 5C:
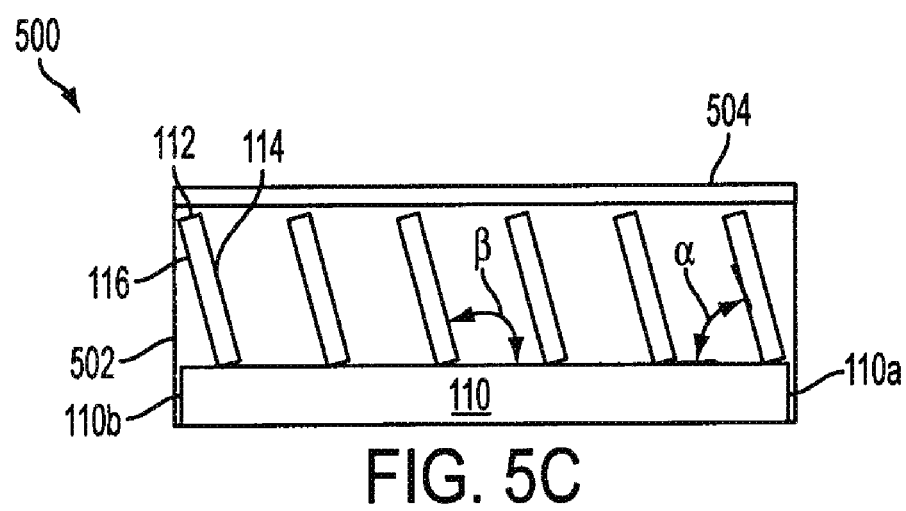

Referring generally to FIGS. 5A-5C, a display system 500 according to a first embodiment may include louver elements 112 coupled to a support structure including a support frame 502. An optional protective member 504 may be disposed over the louver elements 112 to prevent materials such as dust from collecting between adjacent louver elements 112. The protective member 504 is formed of a suitable light-transmissive material to permit light from the sun 106 to be transmitted from the sun, between the louver elements 112, to the light-receiving surface of the photovoltaic cell array 110. In the illustrated embodiment, the protective member 504 may be coupled to the support frame 502. In another embodiment, the protective member 504 may be coupled to the louver elements 504. Although protective member 504 is shown as a separate sheet, it may be only a surface coating and may be flush with the louver elements 112. For example, protective member 504 may be an anti-reflection coating or a scratch-resistant coating. In one embodiment, the space between the louver elements 112 is filled with a transparent material (e.g., glass or transparent polymer) and the protective member 504 is deposited as a thin layer via a solution coating process or a physical vapor deposition process. The protective member 504 may also be a laminated film.

As shown, the display system 500 is provided as a self-supporting system, capable of being selectively disposed in close proximity to the photovoltaic cell array 110 (e.g., so as to be adjacent to the photovoltaic cell array 110) and selectively removable from the photovoltaic cell array 110 (e.g., without damaging the photovoltaic cell array 110). In this sense, the display system 500 is "separably integtated" with the photovoltaic cell array 110. Although FIGS. 5A-5C illustrate a single display system 500 adjacent to the photovoltaic cell array 110, it will be appreciated that more than one display system 500 may be provided adjacent to the photovoltaic cell array 110.

Referring to FIGS. 5A and 5B, the interior width of the support frame 502 corresponds to the width of the photovoltaic cell array 110, which may include one or more photovoltaic cells (e.g., such that the louver elements 112 may suitably extend over the light-receiving surface of the photovoltaic cell array 110). In embodiments where the photovoltaic cell array 110 includes only one photovoltaic cell, the interior width of the support frame 502 corresponds to the width of the photovoltaic cell. In embodiments where the photovoltaic cell array 110 includes more than one photovoltaic cell, the interior width of the support frame 502 may correspond to the width of one photovoltaic cell, to the combined width of more than one photovoltaic cell, or to the combined width of all of the photovoltaic cells.

Referring to FIG. 5C, the louver elements 112 are coupled to the support frame 502 such that an orientation of each louver element 112 is fixed relative to the light-receiving surface of the photovoltaic cell array 110. When coupled to the support frame 502 as described above, an angle, $\alpha$, is formed between the light-receiving surface of the photovoltaic cell array 110 and the non-display surface 116 of each louver element 112 and an angle, $\beta$, is formed between the light-receiving surface of the photovoltaic cell array 110 and the display surface 114 of each louver element 112. Generally, $\alpha$ is about 90° or less and $\beta$ is about 90° or more.

In one embodiment, the angle, $\alpha$, between the light-receiving surface of the photovoltaic cell array 110 and the non-display surface 116 of each louver element 112 is the same. In another embodiment, the angle, $\alpha$, between the light-receiving surface of the photovoltaic cell array 110 and the non-display surface 116 of at least one louver element 112 is different from the angle, $\alpha$, between the light-receiving surface of the photovoltaic cell array 110 and the non-display surface 116 of another of the louver elements 112. For example, the angle, $\alpha$, between the light-receiving surface of the photovoltaic cell array 110 and the non-display surface 116 of one or more of the louver elements 112 may vary such that the angle, $\alpha$, between the light-receiving surface of the photovoltaic cell array 110 and the non-display surface 116 of one or more of the louver elements 112 proximal to the first edge 110a is greater than (or less than) to the angle, $\alpha$, between the light-receiving surface of the photovoltaic cell array 110 and the non-display surface 116 of one or more of the louver elements 112 proximal to the second edge 110b.

In one embodiment, the angle, $\beta$, between the light-receiving surface of the photovoltaic cell array 110 and the display surface 114 of each louver element 112 is the same. In another embodiment, the angle, $\beta$, between the light-receiving surface of the photovoltaic cell array 110 and the display surface 114 of at least one louver element 112 is different from the angle, $\beta$, between the light-receiving surface of the photovoltaic cell array 110 and the display surface 114 of another of the louver elements 112. For example, the angle, $\beta$, between the light-receiving surface of the photovoltaic cell array 110 and the display surface 114 of one or more of the louver elements 112 may vary such that the angle, $\beta$, between the light-receiving surface of the photovoltaic cell array 110 and the display surface 114 of one or more of the louver elements 112 proximal to the first edge 110a is greater than (or less than) to the angle, $\beta$, between the light-receiving surface of the photovoltaic cell array 110 and the display surface 114 of one or more of the louver elements 112 proximal to the second edge 110b.

As described above, the louver elements 112 are coupled to the support frame 502 such that an orientation of each louver element 112 is fixed relative to the light-receiving surface of the photovoltaic cell array 110. In another embodiment, however, the louver elements 112 may be coupled to the support frame 502 such that the orientation of each louver element 112 can be adjusted relative to the light-receiving surface of the photovoltaic cell array 110. In one embodiment, the louver elements 112 may be coupled to the support frame 502 such that the orientation of each louver element 112 can be adjusted independently of other louver elements 112. In another embodiment, the louver elements 112 may be coupled to the support frame 502 such that the orientation of one or more louver elements 112 can be adjusted either individually or simultaneously. This adjustment may occur via a hinge mechanism by mechanically rotating or tilting the louver elements 112 or it may occur by bending the louver elements 112 (e.g. by plastically deforming the louver elements 112).

Figure 5D:
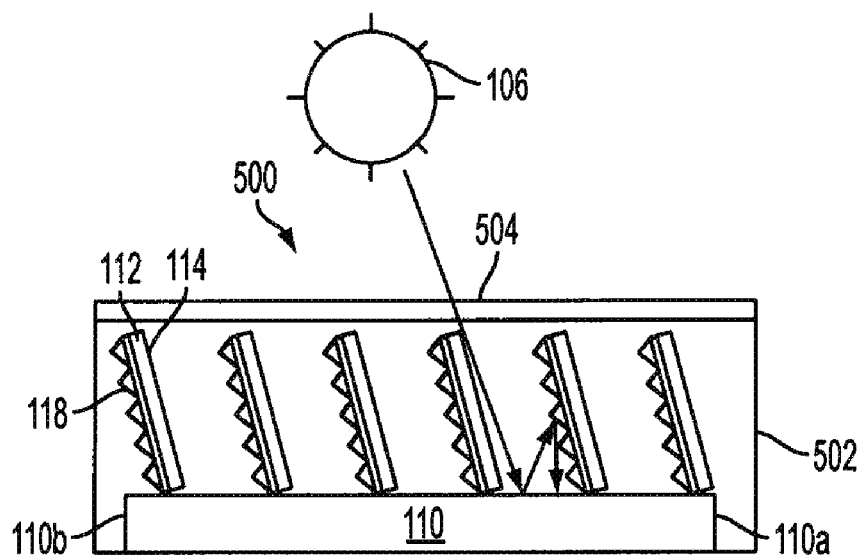
FIGS. 5D and 5E illustrate cross-sectional views of the photovoltaic assembly shown in FIG. 5C, wherein the display system includes louver elements according to some different embodiments.

Although FIG. 5C illustrates each louver element 112 as having a flat display surface 114 and a flat non-display surface 116, it will be appreciated that the display surface 114 and the non-display surface 116 may have any non-planar surface geometry (e.g., curved, undulating, or the like). For example, as shown in FIG. 5D, each louver element 112 may include a non-display surface 118, which is similar to the non-display surface 114, but is textured to redirect light reflected by the light-receiving surface of the photovoltaic cell array 110, back toward the light-receiving surface of the photovoltaic cell array 110. Accordingly, providing a textured non-display surface 118 may enhance the ability of the photovoltaic cell array 110 to generate electricity. In another example shown in FIG. 5E, each louver element 112 may include the aforementioned textured non-display surface 118 as well as a textured display surface 120. As exemplarily shown in FIG. 5E, the texture of the display surface 120 corresponds to the texture of the non-display surface 118. It will be appreciated, however, that the texture of the display surface 120 may not correspond to the texture of the non-display surface 118. Structures such as those shown in FIG. 5D or 5E may be made by any suitable method such as molding, extrusion, embossing, or the like or a combination thereof. The dimensions of the texture pattern may range from the nanometer scale to centimeters and the slope or orientation of the texture elements shown in FIGS. 5D and 5E may be adjusted to provide preferential reflection of light onto the light-receiving surface of the photovoltaic cell array 110. Of course, also in the case of a non-textured surface as in, for example, FIG. 4A, a light reflective non-display surface 116 helps to reflect incident light which is reflected off the light-receiving surface of the photovoltaic cell array 110 back onto the photovoltaic cell array 110.

Figure 5E:
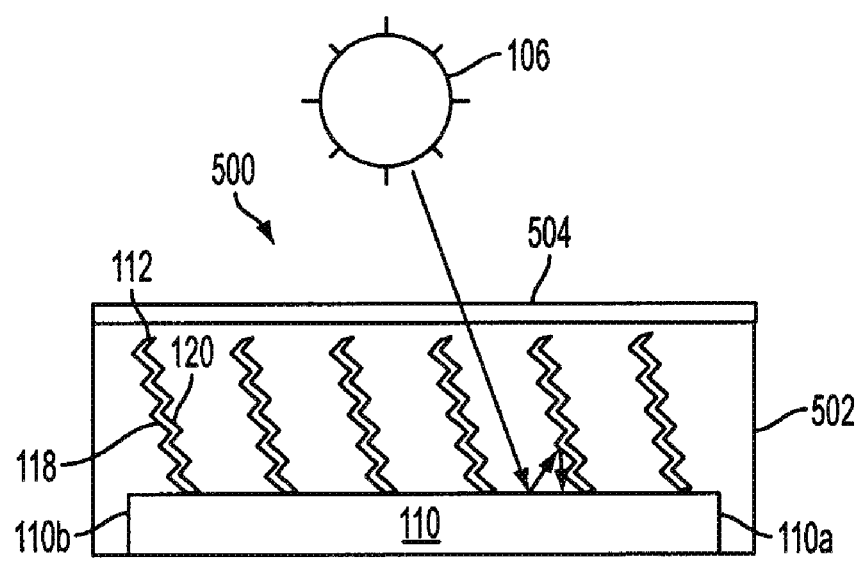

Although FIGS. 5C-5E illustrate display surface 114 and non-display surface 116 of each louver element 112 having the same surface geometry, it will be appreciated that the surface geometry of the display surface 114 (or 120) and/or the non-display surface 116 (or 118) of any louver element 112 may be the same as or different from the surface geometry of the display surface 114 (or 120) and/or the non-display surface 116 (or 118) of any other louver element 112.

Although FIGS. 5C-5E illustrate the display system 500 as including louver elements 112 that protrude from the light-receiving surface of the photovoltaic cell array 110, the display system 500 may also be configured such that the louver elements 112 extend from the light-receiving surface of the photovoltaic cell array 110, but do not protrude from the light-receiving surface of the photovoltaic cell array 110. This may be accomplished by, for example, increasing the height of the support frame 502, reducing the length of the louver elements 112, or the like or a combination thereof.

Figure 6:
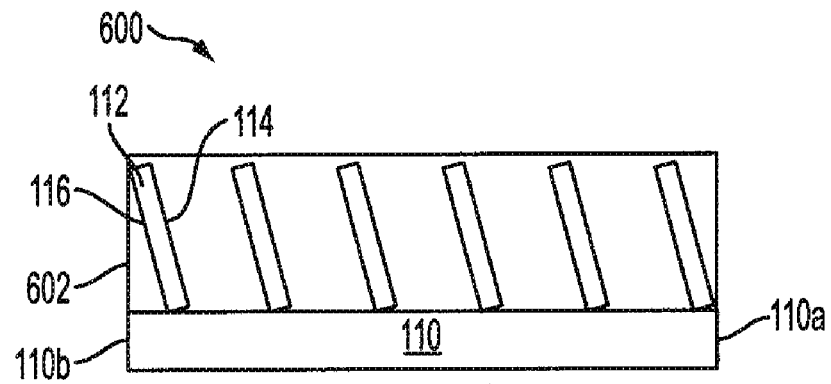
FIG. 6 schematically illustrates a cross-sectional view of a photovoltaic assembly according to a second embodiment.

Although FIGS. 5C-5E illustrate display systems 500 including a support frame 502, it will be appreciated that use of the support frame 502 may be only temporary during assembly of the display system 500. For example, and as shown in FIG. 6, after the louver elements 112 are disposed in close proximity to the photovoltaic cell array 110 (e.g., so as to be adjacent to the photovoltaic cell array 110), and after the louver elements 112 are oriented in a desired manner relative to the light-receiving surface of the photovoltaic cell array 110, the space between adjacent louver elements 112 may be filled with a fill material 602. The fill material 602 is a suitable light-transmissive material that permits light from the sun to be transmitted between the louver elements 112 to the light-receiving surface of the photovoltaic cell array 110. Exemplary materials for the fill material 602 may include polymers (e.g., liquid acrylic resins, fluorinated silicone, a UV-curable adhesive from Norland Products, Inc. of Cranbury, N.J., silicones, acrylates, acetates, EVA, fluoropolymers, hotmelt polymers, or the like or a combination thereof), glass, or the like, or a combination thereof. Thus, the fill material 602 may fix the louver elements 112 relative to one another and to the light-receiving surface of the photovoltaic cell array 110. The fill material 602 may be applied in a liquid or viscous state that can be solidified (e.g., by curing, cooling, etc.). In one embodiment, the fill material 602 may have a refractive index that reduces reflection losses at the interfaces between the display system 700 and the photovoltaic cell array 110. In one embodiment, the fill material 602 may have a refractive index that reduces reflection losses at the interfaces between the display system 700 and the photovoltaic cell array 110. After the fill material solidifies, the support frame 502 may be removed yielding, for example, the display system 600 shown in FIG. 6. In one example, the louver elements 112 may be strips of biaxially-oriented polyethylene terephthalate (boPET) film, metallized nylon film or metalized polycarbonate. The strips may be colored on the display surface 114 thereof (e.g. by printing).

In one embodiment, the louver elements 112 shown in FIG. 5C may be formed from thin sheet metal (e.g., aluminum) by, for example, stamping or laser-cutting a stripe pattern and then bending (or twisting) the metal stripes out of plane at a desired tilt angle. This method can be similar to methods in which louver screens over air ducts are made. In this case, the support frame 502 would be integral with the louver elements 112. In this embodiment, the display surfaces 114 of the louver elements 112 would be painted in a desired color or pattern and the non-display surfaces 116 of the louver elements 112 would be patterned or painted to reflect light back onto the light-receiving surface of the photovoltaic cell array 110 when the display system is adjacent to the light-receiving surface of the photovoltaic cell array 110. The described cutting and bending approach from a sheet of metal may be of course also performed in other materials, such as plastics. In plastics, the out-of-plane bending may be assisted by heat to soften the material or to prevent cracking. In the described method, the space between the louver elements 112 may be filled with fill material 602 (e.g., to prevent dust accumulation between the louver elements 112). This filling process may occur directly on the light-receiving surface of the photovoltaic cell array 110 (e.g., after the louver elements 112 are arranged adjacent to the light-receiving surface of the photovoltaic cell array 110). The filling process may also occur independently of the photovoltaic cell array 110. For example, the display system having the fill material 602 between the lover elements 112 can be laid or laminated onto the light-receiving surface of the photovoltaic cell array 110.

Figure 7:
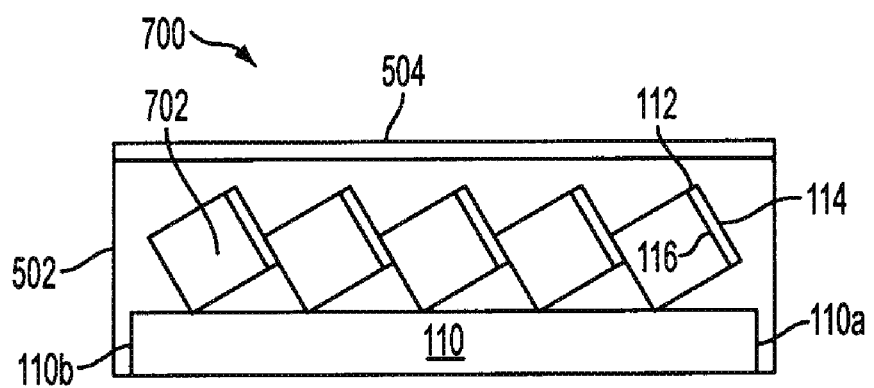
FIG. 7 schematically illustrates a cross-sectional view of a photovoltaic assembly according to a third embodiment.

Referring to FIG. 7, a display system 700 according to a third embodiment may include louver elements 112 coupled to a support structure including the support frame 502 and a plurality of support beams 702. Each louver element 112 may be coupled to a corresponding support beam 702. The support beams 702, in turn, are coupled the support frame 502 in a manner similar to that in which the louver elements 112 are coupled to the support frame 502 as discussed above with respect to FIGS. 5A-5C. The support frame 502 includes cut-outs defined therein that receive ends of the support beams 702, thereby holding the support beams 702 in place.

In one embodiment, the support beams 702 are formed of a suitable light-transmissive material that permits light from the sun to be transmitted between the louver elements 112 to the light-receiving surface of the photovoltaic cell array 110. Exemplary materials for the support beams 702 include polymers (e.g., poly(methyl methacrylate) (PMMA) or other acrylates, silicones, urethanes, biaxially-oriented polyethylene terephthalate (boPET) film, or the like or a combination of thereof), glass, or the like or a combination thereof. The support beams 702 may be formed according to any suitable process such as molding, embossing, printing, extrusion, cutting, or the like or a combination thereof. In one embodiment, the support beams 702 may have a refractive index that reduces reflection losses at the interfaces between the display system 700 and the photovoltaic cell array 110. For example, the support beams 702 may have a refractive index between 1.4 and 1.6.

Generally, the louver elements 112 may be provided as a single material layer or as a composite material layer, as exemplarily described above. In one embodiment, the louver elements 112 may be formed by coating one side of the each support beam 702 with a first layer of material and a second layer of material. Accordingly, the first layer of material may correspond to the first material 202 described above with respect to FIG. 2B and the second layer of material may correspond to the second material 204 described above with respect to FIG. 2B. The first and second layers of material may be formed onto each support beam 702 by any suitable method (e.g., printing, roller coating, vacuum evaporation, sputtering, cathodic arc deposition, plating, or the like or a combination thereof). The first layer of material may include a material that can reflect light onto the light-receiving surface of the photovoltaic cell array 110 while the second layer of material may include a colored material that can be viewed by an observer. In one embodiment, the first layer of material may include white paint, a solution containing silver nanoparticles, an aluminum film, or the like, or a combination thereof. In one embodiment, the second layer of material may include pigmented ink, or the like, or a combination thereof.

In one embodiment, the second layer of material may be formed by other methods such as other methods such as lamination, laser transfer, sublimation printing, or the like or a combination thereof.

In another embodiment, the louver elements 112 and the support beams 702 may be formed by a co-extrusion process in which a material used to form the louver element 112 is co-extruded with a material used to form the support beams 702. In one embodiment, co-extrusion may occur by co-extruding a clear polymer or glass along with a pigment-loaded colored polymer or glass. Co-extruded clear and colored polymers may be radiation-curable (e.g., UV curable) or they may be extruded from a melt and solidify upon cooling. Co-extruded clear and colored glass may be extruded from a melt and solidify upon cooling. In one embodiment, multiple co-extruded pieces (each including a support beam 702 and a louver element 112) may be produced by known extrusion methods and, subsequently, assembled into the display system 700. In another embodiment, a single co-extruded piece (including a support beam 702 and a louver element 112) may be produced by known extrusion methods and, subsequently, divided (e.g., by cutting by laser, saw, etc.) into multiple pieces which are then assembled into the display system 700. In yet another embodiment, a single co-extruded (including multiple support beams 702 and multiple louver elements 112), also referred to herein as a "sheet," may be produced by known extrusion methods and, subsequently, assembled into the display system 700.

Although FIG. 7 illustrates the support beams 702 as having a square cross-sectional area, it will be appreciated that the support beams 702 may have a cross-sectional area of any shape (e.g., triangular, hexagonal, trapezoidal, circular, crescent, etc.). Moreover, although FIG. 7 illustrates each support beam 702 as having the same cross-sectional area and size, it will be appreciated that one or more of the support beams 702 may have different cross-sectional areas and/or sizes.

Although FIG. 7 illustrate a display system 700 including a support frame 502, it will be appreciated that use of the support frame 502 may be only temporary during assembly of the display system 700. Accordingly, after the louver elements 112 are disposed in close proximity to the photovoltaic cell array 110 (e.g., so as to be adjacent to the photovoltaic cell array 110), and after the louver elements 112 are oriented in a desired manner relative to the light-receiving surface of the photovoltaic cell array 110, the space between adjacent support beams 702 and louver elements 112 may be filled with a suitable fill material in the manner described above with respect to FIG. 6. After the fill material solidifies, the support frame 502 may be removed.

Although FIG. 7 illustrates the display system 700 as including louver elements 112 that extend away from the light-receiving surface of the photovoltaic cell array 110—but that do not protrude from the light-receiving surface of the photovoltaic cell array 110—the display system 700 may also be configured such that the louver elements 112 protrude from the light-receiving surface of the photovoltaic cell array 110 (e.g., by reconfiguring the support beams 702).

Figure 8:
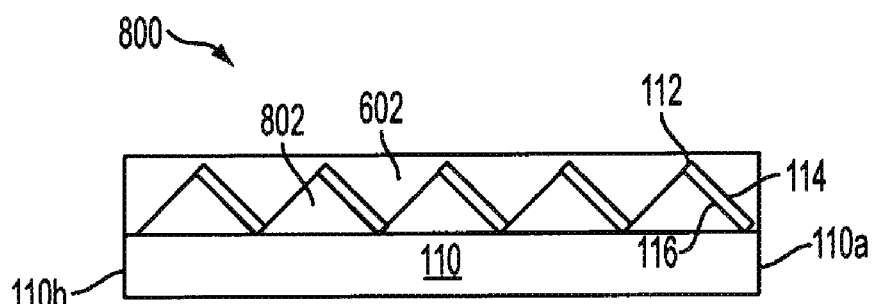
FIG. 8 schematically illustrates a cross-sectional view of a photovoltaic assembly according to a fourth embodiment.

Referring to FIG. 8, a display system 800 according to a fourth embodiment may include louver elements 112 coupled to a support structure including a plurality of support beams 802 disposed directly on the light-receiving surface of the photovoltaic cell array 110. The display system 800 may optionally include the fill material 602 disposed over the support beams 802 and the louver elements 112. The support beams 802 may be formed in the same or similar manner as the support beams 702 described above with respect to FIG. 7.

The support beams 802 may be formed as separate pieces or as a single, integral piece. The louver elements 112 may be formed in the same or similar manner as the louver elements 112 described above with respect to FIG. 7. In one embodiment, the display system 800 may be formed by co-extruding material used to form the louver elements 112 with the material used to form the support beams 802 (e.g., as exemplarily described above with respect to FIG. 7).

In one embodiment, the display system 800 may be formed as a self-supporting system, capable of being selectively disposed in close proximity to the photovoltaic cell array 110 (e.g., so as to be adjacent to the photovoltaic cell array 110). In such an embodiment, the display system 800 may be formed on a work surface (e.g., a thin film substrate of a transparent or translucent polymeric material. After being formed, the display system 800 may be removed from the work surface and fixed to the light-receiving surface of the photovoltaic cell array 110 via an adhesive material (not shown). In embodiments where the thin film substrate is formed of a suitable light-transmissive material, the display system 800 may be left on the thin film substrate and an adhesive material may be used to bond the thin film substrate to the light-receiving surface of the photovoltaic cell array 110. In one embodiment, the adhesive material may be material such as a pressure sensitive adhesive tape, a liquid curable adhesive, or the like or a combination thereof. In one embodiment, the adhesive material is an "index matching material," having a refractive index that reduces reflection losses (e.g., at the interfaces between the display system 800 and the photovoltaic cell array 110). It will be appreciated, however, that the adhesive material may not be needed if the support beams 802 and/or the fill material 602 is of a tacky nature or if it becomes tacky or adhesive at elevated temperatures.

In another embodiment, the display system 800 may be provided as a self-supporting system, capable of being selectively disposed in close proximity to the photovoltaic cell array 110 and of being selectively removable from the photovoltaic cell array 110 (e.g., without damaging the photovoltaic cell array 110). Thus, the display system 800 may be separably integrated with the photovoltaic cell array 110. In such an embodiment, the display system 800 may be disposed within a frame (not shown) that, in turn, is disposed in close proximity to the photovoltaic cell array 110 (e.g., so as to be adjacent to the photovoltaic cell array 110). In another example, the support beams 802, the louver elements 112 and/or the fill material 602 may be provided as a sufficiently rigid material that can be disposed in close proximity to the photovoltaic cell array 110 (e.g., so as to be adjacent to the photovoltaic cell array 110).

In yet another embodiment, the display system 800 may be formed by forming the support beams 802 simultaneously with the fabrication of the photovoltaic cell array 110 (e.g., when one or more outer layers of the photovoltaic cell array are formed). Subsequently, the louver elements 112 are disposed on the support beams 802 and the fill material 602 is formed over the support beams 802 and louver elements 112. In this sense, the display system 800 may be permanently integrated with the photovoltaic cell array 110.

In still another embodiment, the display system 800 may be formed by forming the fill material 602 simultaneously with the fabrication of the photovoltaic cell array 110 (e.g., when one or more outer layers of the photovoltaic cell array are formed), after disposing the support beams 802 and louver elements 112 in close proximity to the photovoltaic cell array 110. In this sense, the display system 800 may be permanently integrated with the photovoltaic cell array 110.

Although FIG. 8 illustrates the display system 800 as including louver elements 112 that protrude from the light-receiving surface of the photovoltaic cell array 110, the display system 800 may also be configured such that the louver elements 112 extend from the light-receiving surface of the photovoltaic cell array 110, but do not protrude from the light-receiving surface of the photovoltaic cell array 110. This may be accomplished by, for example, forming the louver elements 112 such that lower ends thereof are disposed at a location between the upper and lower ends of corresponding support beams 802.

As exemplarily described above, the support elements shown in FIGS. 7 and 8 are provided as solid support beams. It will be appreciated, however, that the support beams 702 and 802 may be provided as hollow support beams defining an interior channel within which a fluid may flow. The fluid may include a gas (e.g., air or the like), a liquid (e.g., water, oil, or the like, or a combination thereof) or a combination thereof. For example, referring to FIG. 9, a display system 900 according to a fifth embodiment may include louver elements 112 coupled to a support structure including a plurality of support beams 902. Although adjacent ones of the support beams 902 are illustrated as being spaced apart from each other, adjacent ones of the support beams 902 may be disposed so as to contact each other. The support beams 902 are hollow and define an interior channel 904 within which a fluid may flow. The interior channels 904 of the support beams 902 may be in fluid communication with each other and/or a heat sink (not shown). The diameter of the interior channel 904 may be range from the sub-millimeter range up to several centimeters. In one example, the diameter of the interior channel 904 is about 5 mm. Fluid flowing within one or more of the interior channels 904 may be used to carry heat away from the light-receiving surface of the photovoltaic cell array 110. Moreover, a pump (not shown) may be provided to circulate the fluid within the interior channels 904.

In one embodiment, the support beams 902 may be provided in the same or similar manner as the support beams 702 described above with respect to FIG. 7. In another embodiment, one or more of the support beams 902 may be formed of an opaque (or substantially opaque) material that absorbs light transmitted from the sun and converts the absorbed light into heat. In one embodiment, the louver elements 112 may be provided in the same or similar manner as the louver elements 112 described above with respect to FIG. 7. In another embodiment, the non-display surface 116 of one or more of the louver elements 112 may be formed of an opaque (or substantially opaque) material that absorbs light transmitted from the sun and converts the absorbed light into heat. In one embodiment, the display system 900 may be formed by co-extruding material used to form the louver elements 112 with the material used to form the support beams 902 (e.g., as exemplarily described above with respect to FIG. 7).

The display system 900 may be provided as a self-supporting system as exemplarily described with respect to FIG. 8, that is separably integrated with the photovoltaic cell array 110, or that is permanently integrated with the photovoltaic cell array 110, as exemplarily described with respect to FIG. 8. The display system 900 may optionally include the fill material 602 disposed over the support beams 902 and the louver elements 112.

Figure 9:
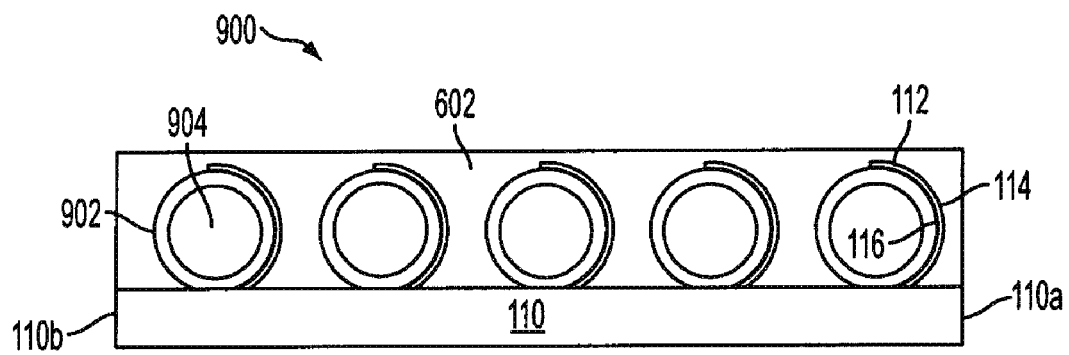
FIG. 9 schematically illustrates a cross-sectional view of a photovoltaic assembly according to a fifth embodiment.

Although FIG. 9 illustrates the display system 900 as including louver elements 112 that protrude from the light-receiving surface of the photovoltaic cell array 110, the display system 900 may also be configured such that the louver elements 112 extend from the light-receiving surface of the photovoltaic cell array 110, but do not protrude from the light-receiving surface of the photovoltaic cell array 110 as exemplarily described above with respect to FIG. 8.

Figure 10:
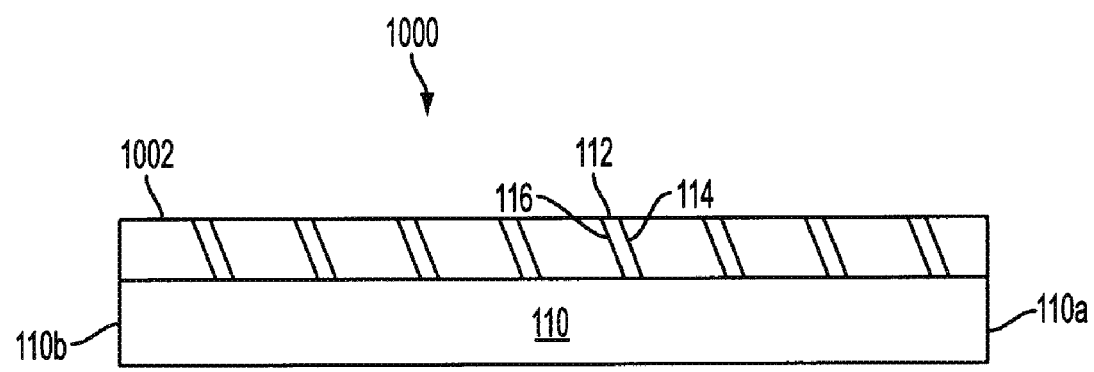
FIG. 10 schematically illustrates a cross-sectional view of a photovoltaic assembly according to a sixth embodiment.

Referring to FIG. 10, a display system 1000 according to a sixth embodiment may include louver elements 112 coupled to a support structure including support film 1002. The support film 1002 is formed of a material that is the same as or similar to the material of the support beams 702 described above with respect to FIG. 7. The louver elements 112 are formed of a material that is the same as or similar to the material described above with respect to FIG. 7.

In one embodiment, the display system 1000 may be formed by co-extruding material used to form the louver elements 112 with the material used to form the support film 1002 (e.g., as exemplarily described above with respect to FIG. 7). The co-extrusion may be performed directly on the light-receiving surface of the photovoltaic cell array 110. In another embodiment, co-extrusion may be performed on a work surface as exemplarily described above with respect to FIG. 8. The display system 1000 may then be fixed to the light-receiving surface of the photovoltaic cell array 110 (with or without the work surface) as exemplarily described above with respect to FIG. 8.

Figure 11A:
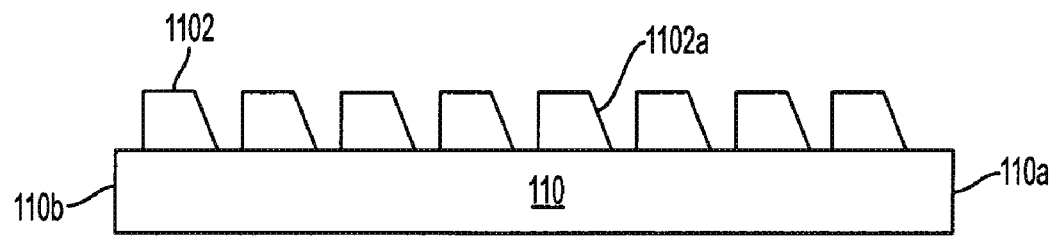
FIGS. 11A-11C illustrate a method of forming the photovoltaic assembly shown in FIG. 10, according to one embodiment.
Figure 11B:
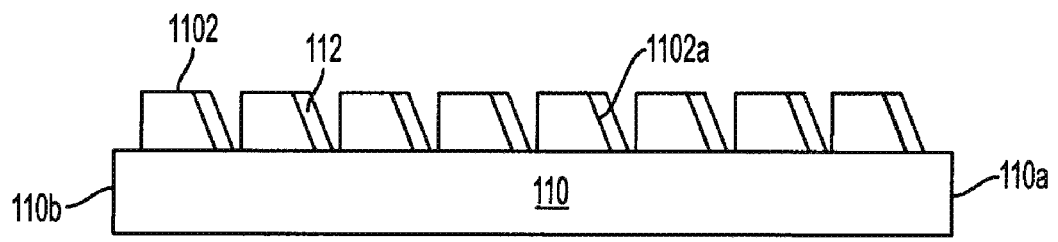
Figure 11C:
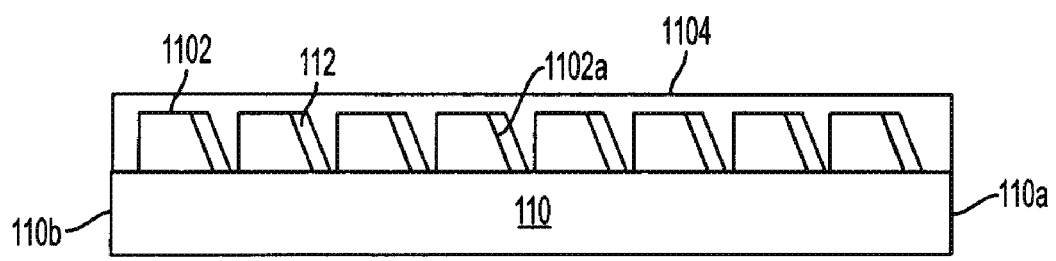

In another embodiment, the display system 1000 may be formed according to a process exemplarily described with respect to FIGS. 11A-11C. Referring to FIG. 11A, a plurality of molded patterns 1102 are formed on the light-receiving surface of the photovoltaic cell array 110. In one embodiment, the material of the molded patterns 1102 may be the same material as the support film 1002 shown in FIG. 10. In one embodiment, the plurality of molded patterns 1102 are formed by depositing a first material layer (not shown) on the light-receiving surface of the photovoltaic cell array 110 and then embossing the first material layer on the light-receiving surface of the photovoltaic cell array 110. In another embodiment, the plurality of molded patterns 1102 are formed first by molding the material onto a thin film substrate, which is then fixed to the light-receiving surface of the photovoltaic cell array 110 as exemplarily described above with respect to FIG. 8. The molded patterns 1102 may also be formed by printing or extrusion techniques instead of molding.

Referring to FIG. 11B, the louver elements 112 are formed on a surface 1102a of each molded pattern 1102 (e.g., by printing). In another embodiment, the louver elements 112 may be co-extruded with the plurality of molded patterns 1102 as exemplarily described above with respect to FIG. 7. The co-extruded pieces may then be fixed to the light-receiving surface of the photovoltaic cell array 110 as exemplarily described above with respect to FIG. 8.

Referring to FIG. 11C, a second material layer 1104 is formed on the molded patterns 1102 and on the louver elements 112. The upper portion of the second material layer 1104 may be removed (e.g., by etching, polishing, or the like or a combination thereof) to obtain the structure shown in FIG. 10. In one embodiment, the material of the second material layer 1104 may be the same material as the support film 1002 shown in FIG. 10. Accordingly, after removing the upper portion of the second material layer 1104, the combined structure of the molded patterns 1102 and the second material layer 1104 may be regarded as forming the support film 1002. It will be appreciated, however, that the upper portion of the second material layer 1104 need not be removed.

In another embodiment, the processes described above with respect to FIGS. 11A-11C may be performed on a work surface as exemplarily described above with respect to FIG. 8.

The display system 1100 may then be fixed to the light-receiving surface of the photovoltaic cell array 110 (with or without the work surface) as exemplarily described above with respect to FIG. 8.

Figure 12A:
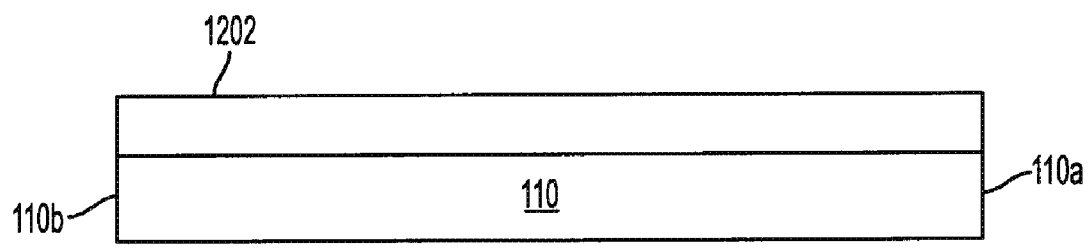
FIGS. 12A and 12B illustrate a method of forming the photovoltaic assembly shown in FIG. 10, according to another embodiment.
Figure 12B:
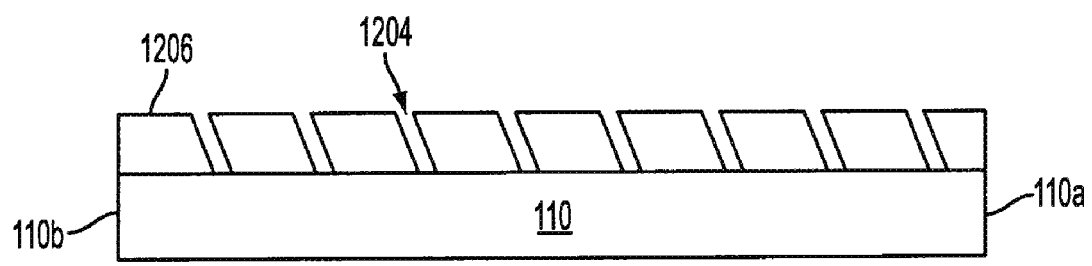

In another embodiment, the display system 1000 may be formed according to a process exemplarily described with respect to FIGS. 12A and 12B. Referring to FIG. 12A, a material layer 1202 is formed on the light-receiving surface of the photovoltaic cell array 110. In one embodiment, the material of the material layer 1202 may be the same material as the support film 1002.

Referring to FIG. 12B, grooves 1204 are formed within the material layer 1202, thereby forming a plurality of support patterns 1206. Collectively, the support patterns 1206 constitute the support film 1002. The grooves 1204 may be formed by techniques such as laser-cutting, machine-cutting, etc. In another embodiment, the support patterns 1206 are formed first by extrusion (and, optionally, cutting) techniques, which are then fixed to the light-receiving surface of the photovoltaic cell array 110 as exemplarily described above with respect to FIG. 8 so as to be spaced apart from each other to form the grooves 1204.

The louver elements 112 are then formed within the grooves 1204 (e.g., by selective printing such as inkjet printing, global deposition followed by surface removal using a blade, etc.). In another embodiment, the louver elements 112 may be co-extruded with the support patterns 1206 as exemplarily described above with respect to FIG. 8. The co-extruded pieces may then be fixed to the light-receiving surface of the photovoltaic cell array 110 as exemplarily described above with respect to FIG. 8.

In another embodiment, the processes described above with respect to FIGS. 12A and 12B may be performed on a work surface as exemplarily described above with respect to FIG. 8. The display system 1100 may then be fixed to the light-receiving surface of the photovoltaic cell array 110 (with or without the work surface) as exemplarily described above with respect to FIG. 8.

The display system 1000 may be provided as a self-supporting system as exemplarily described with respect to FIG. 8, that is separably integrated with from the photovoltaic cell array 110, or that is permanently integrated with the photovoltaic cell array 110, as exemplarily described with respect to FIG. 8.

Figure 13:
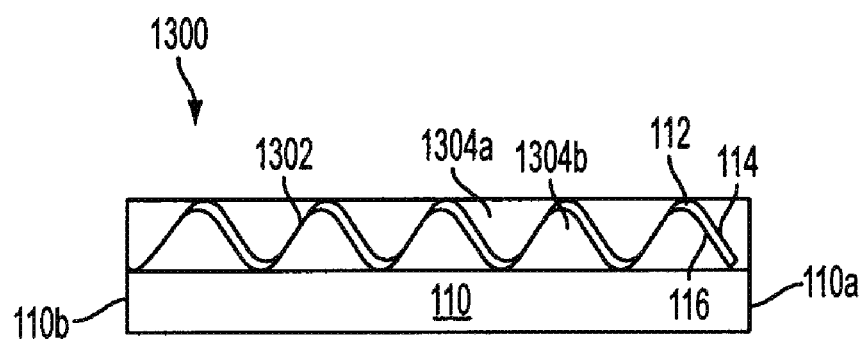
FIG. 13 schematically illustrates a cross-sectional view of a photovoltaic assembly according to a seventh embodiment.

Referring to FIG. 13, a display system 1300 according to a seventh embodiment may include louver elements 112 coupled to a support structure including a flexible film 1302. Each louver element 112 may be disposed on an upper surface of the flexible film 1302. The louver elements 112 may be provided in the same or similar manner as the louver elements 112 described above with respect to FIG. 7. The flexible film 1302 is formed of a suitable light-transmissive material that is the same as or similar to the material of the support beams 702 exemplarily described above with respect to FIG. 7. The display system 1300 may further include an optional overcoat material 1304a disposed over the flexible film 1302 and the louver elements 112. The overcoat material 1304a may be formed of a suitable light-transmissive material that is the same as or similar to the material of the fill material 602 exemplarily described above with respect to FIG. 6. In one embodiment, the display system 1400 may further include an optional support material 1304b located under the flexible film 1302 and the louver elements 112. The support material 1304b may be formed of a suitable light-transmissive material that is the same as or similar to the material of the fill material 602 exemplarily described above with respect to FIG. 6.

Figure 14A:
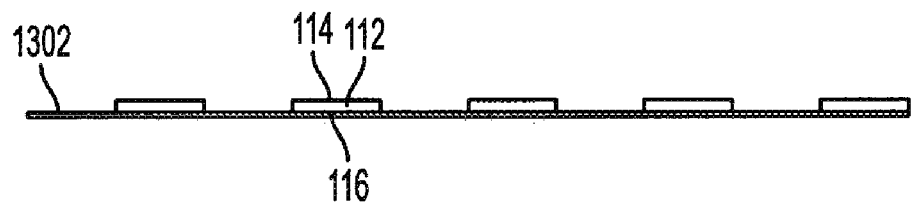
FIGS. 14A and 14B illustrate a method of forming the photovoltaic assembly shown in FIG. 13, according to one embodiment.

Referring to FIG. 14A, the display system 1300 shown in FIG. 13 may be formed by first providing a flat flexible film 1302 and forming louver elements 112 on the flexible film 1302. In one embodiment, the louver elements 112 may be formed on the flexible film 1302 by forming a material layer on the flexible film 1302 (e.g., as exemplarily described above with respect to FIG. 7) and patterning the material layer (e.g., by photolithography, shadow masking, laser ablation, or the like or a combination thereof). In another embodiment, the louver elements 112 may be formed by adhering pre-formed louver elements 112 to the flexible film 1302 via an adhesive material (not shown).

Figure 14B:
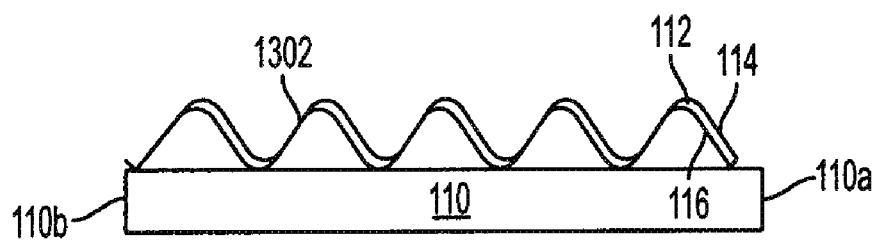

Referring to FIG. 14B, the flexible film 1302 is then bent to create a non-planar surface (e.g., an undulating surface) and disposed over the light-receiving surface of the photovoltaic cell array 110. The flexible film 1302 may be adhered to the light-receiving surface of the photovoltaic cell array 110 by an adhesive material as exemplarily described above with respect to FIG. 8. Next, the overcoat material 1304a is coated over the bent flexible film 1302 and the support material 1304b is injected under the bent flexible film 1302, yielding the structure shown in FIG. 10. In another embodiment, however, the support material 1304b may be formed on the light-receiving surface of the photovoltaic cell array 110 (e.g., by molding, embossing, extrusion, printing, or the like or a combination thereof) before the flexible film 1302 is applied. In this case, the flexible film 1302 can be laminated over the support material 1304b. In yet another embodiment, the support material 1304b may be formed on a work surface as exemplarily described above with respect to FIG. 8 and the flexible film 1302 may be laminated over the support material 1304b. The display system 1300 may then be fixed to the light-receiving surface of the photovoltaic cell array 110 (with or without the work surface) as exemplarily described above with respect to FIG. 8.

The display system 1300 may be provided as a self-supporting system as exemplarily described with respect to FIG. 8, that is separably integrated with the photovoltaic cell array 110, or that is permanently integrated with the photovoltaic cell array 110, as exemplarily described with respect to FIG. 8.

Although FIGS. 13-14B illustrate the display system 1300 as including louver elements 112 that protrude from the light-receiving surface of the photovoltaic cell array 110, the display system 1300 may also be configured such that the louver elements 112 extend from the light-receiving surface of the photovoltaic cell array 110, but do not protrude from the light-receiving surface of the photovoltaic cell array 110. This may be accomplished by, for example, adjusting where the flexible film 1302 is bent, where the louver elements 112 are formed on the flexible film 1302, the length of the louver elements 112 on the flexible film 1302, the thickness of the support material 1304b, or the like or a combination thereof.

As described above, a display system may be configured such that the display surface 114 of each louver element 112 included therein faces toward the first edge 110a of an associated photovoltaic cell array 110. In another embodiment, however, a display system may be configured such that the display surface 114 of at least one louver element 112 included therein faces toward the first edge 110a of an associated photovoltaic cell array 110 while the display surface 114 of at least one other louver element 112 included therein faces toward the second edge 110b of the associated photovoltaic cell array 110. For example, referring to FIG. 15, a display system 1500 according to an eighth embodiment may be provided as similarly described above with respect to FIGS. 5A-5C.

Figure 15:
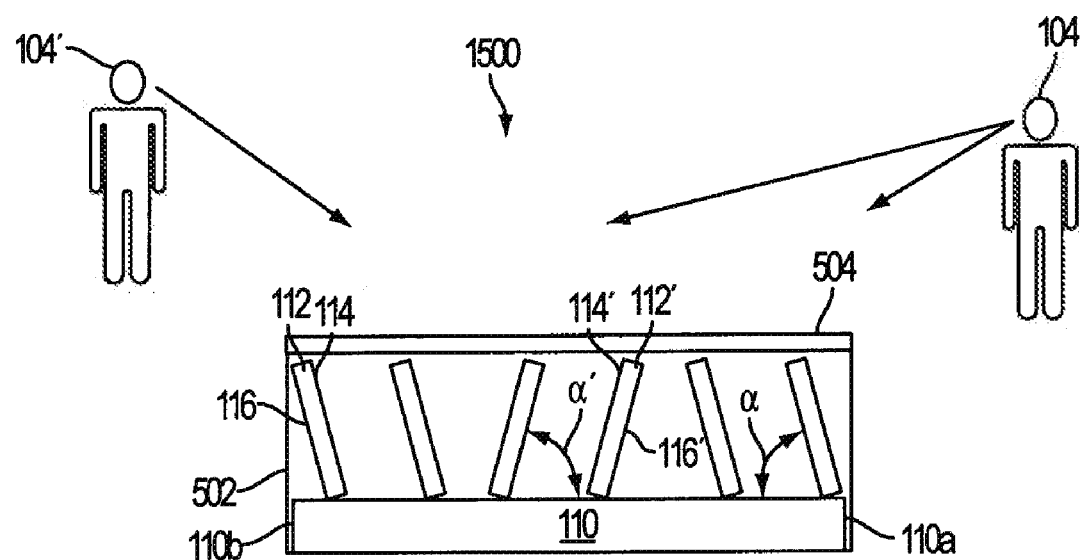
FIG. 15 illustrates a photovoltaic assembly according to an eighth embodiment.

As shown in FIG. 15, the display system 1500 includes louver elements 112 in addition to louver elements 112'. Each louver element 112' includes a display surface 114' and a non-display surface 116' similar to the aforementioned display surface 114 and non-display surface 116, respectively. In the display system 1500, however, display surfaces 114' of louver elements 112' face toward a different edge of the photovoltaic cell array 110 (e.g., toward the second edge 110b) than the display surfaces 114 of louver elements 112. By providing a display system 1200 having louver elements 112 and 112' with display surfaces 114 and 114' facing toward different edges of the photovoltaic cell array 110, different images may be presented to different observers 104 and 104'. Although the display system 1500 is described above as similar to the display system 500, it will be appreciated that the display system 1500 may also be provided as similarly described above with respect to any of FIGS. 6-14B.

Figure 16:
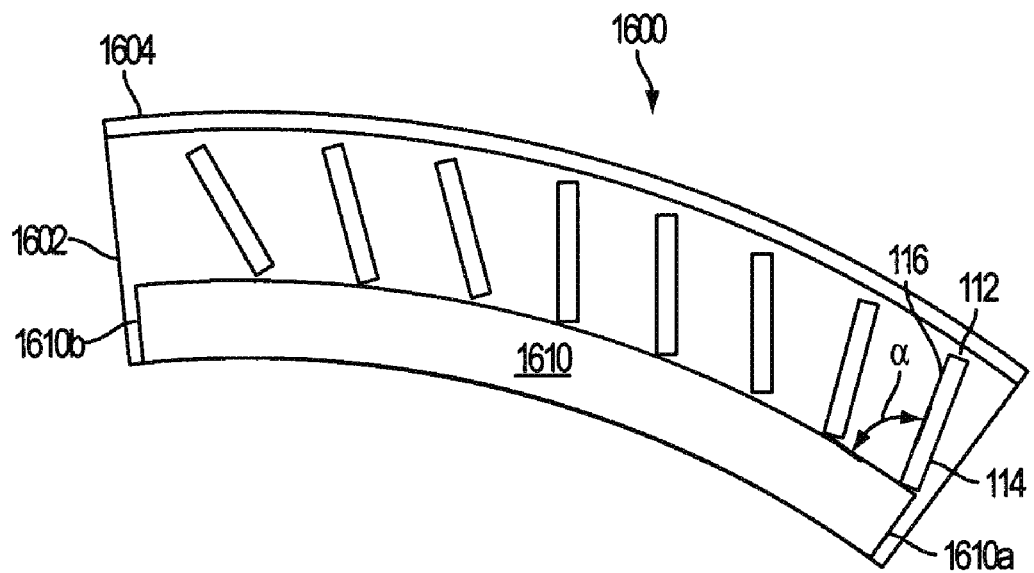
FIG. 16 illustrates a photovoltaic assembly according to a ninth embodiment.

As described above, a photovoltaic assembly includes a photovoltaic cell array 110 that is flat. In another embodiment, however, a photovoltaic assembly may include a photovoltaic cell array that is curved. Such a photovoltaic assembly may, therefore, include a display system that is curved to correspond to a curvature of the photovoltaic cell array. For example, referring to FIG. 16, a display system 1600 according to a ninth embodiment may be provided as similarly described above with respect to FIGS. 5A-5C, but be curved to correspond to a curvature of the photovoltaic cell array 1610 (e.g., having a light-receiving surface, a first edge 1610a and a second edge 1610b). In FIG. 16, support frame 1602 corresponds to support frame 502 and protective member 1604 corresponds to protective member 504.

As shown in FIG. 16, the angle, α, between the light-receiving surface of the photovoltaic cell array 1610 and the non-display surface 116 of the louver elements 112 may vary such that the angle, α, between the light-receiving surface of the photovoltaic cell array 110 and the non-display surface 116 of one or more of the louver elements 112 proximal to the first edge 1610a is greater than to the angle, α, between the light-receiving surface of the photovoltaic cell array 1610 and the non-display surface 116 of one or more of the louver elements 112 proximal to the second edge 1610b. In another embodiment, the angle, α, between the non-display surface 116 of each louver element 112 and a portion of the light-receiving surface of the photovoltaic cell array 1610 proximate to the non-display surface 116 is the same. Although the display system 1600 is described above as similar to the display system 500, it will be appreciated that the display system 1600 may also be provided as similarly described above with respect to any of FIGS. 6-15.

As described above, a photovoltaic assembly includes photovoltaic cell arrays that are flat or curved, but that are substantially rigid. In another embodiment, however, the photovoltaic cell arrays in any of the photovoltaic assemblies described above may be provided as a flexible photovoltaic cell array. In such an embodiment, any of the display systems described above with respect to FIGS. 6-16 may also be flexible so that the entire photovoltaic assembly is flexible. Such a flexible photovoltaic assembly may be used as a solar blanket to cover any object or may be coupled with bags, clothing, awnings, umbrellas, etc. Flexibility is achieved by using materials that are thin or flexible. For example, the support frame 1602 and protective member 1604 may be made of substantially elastomeric materials (e.g., silicones, urethanes, or the like or a combination thereof). The louver elements 112 may also be made of elastomeric material. Most elastomeric materials can reversibly stretch between 5-700%.

Figure 17A:
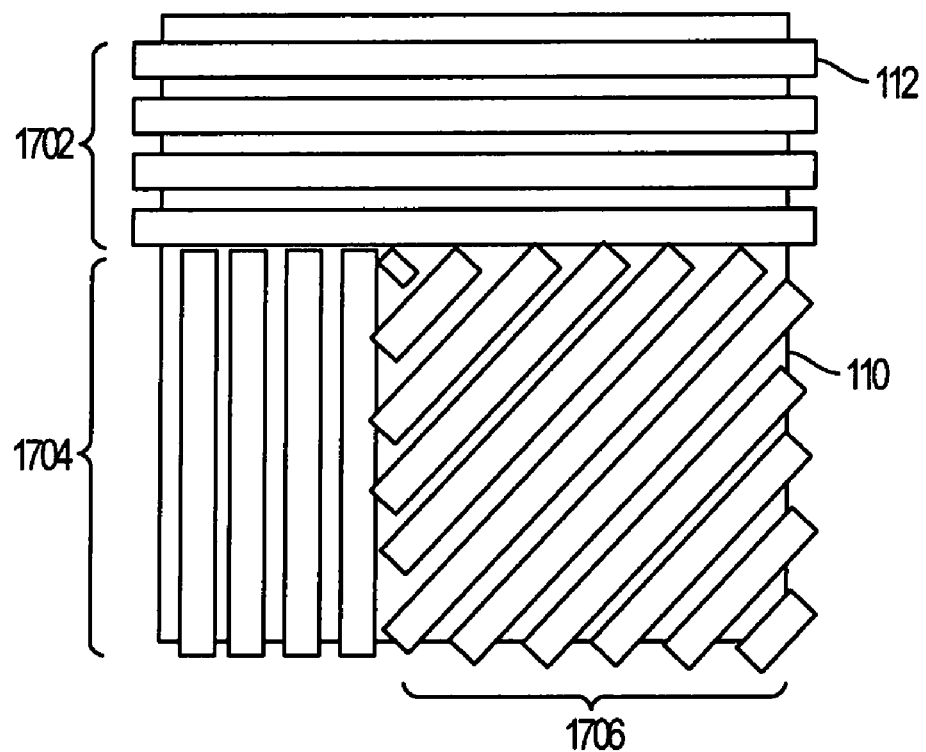
FIGS. 17A-17C schematically illustrate top plan views of arrangements of louver elements over a photovoltaic cell array, according to some embodiments.

As described above, the louver elements 112 within a display system extend along the same (or substantially the same) direction when viewed in a top plan view. In another embodiment, however, one or more louver elements 112 within a display system may extend along different directions when viewed in a top plan view. For example, referring to FIG. 17A, groups of louver elements 112 may be arranged in different domains (e.g., first domain 1702, second domain 1704 and third domain 1706). It will be appreciated that groups of louver elements 112 may be arranged in more or less domains than those illustrated. Louver elements 112 within a domain extend along the same (or substantially the same direction) whereas louver elements 112 within different domains do not extend along different directions. The orientation of the photovoltaic cells (current flow direction) may also vary locally according to the description above relative to FIG. 4B.

Figure 17B:
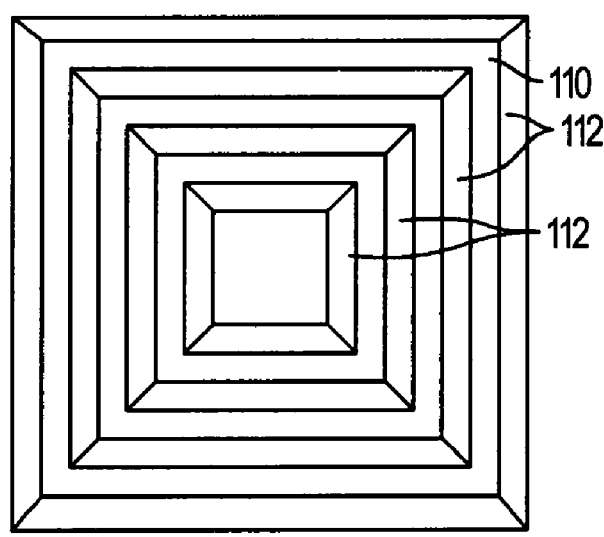

As described above, the louver elements 112 within a display system are arranged in a pattern having an essentially linear shape when viewed in a top plan view. In another embodiment, however, one or more louver elements 112 may be arranged in a pattern having any shape. For example, referring to FIG. 17B, louver elements 112 may have a shape that corresponds to the shape of the photovoltaic cell array 110 (e.g., a square shape). As shown, the louver elements 112 may be arranged in patterns that are concentric with each other. It will be appreciated that the louver elements 112 may arranged in patterns that are not concentric with each other. Although FIG. 17B illustrates the louver elements 112 as being arranged in patterns having the same shape when viewed in a top plan view, it will be appreciated that the louver elements 112 may be arranged in patterns that have different shapes (e.g., the aforementioned linear shape, a polygonal shape, a curved shape, or the like or a combination thereof) when viewed in a top plan view.

Figure 17C:
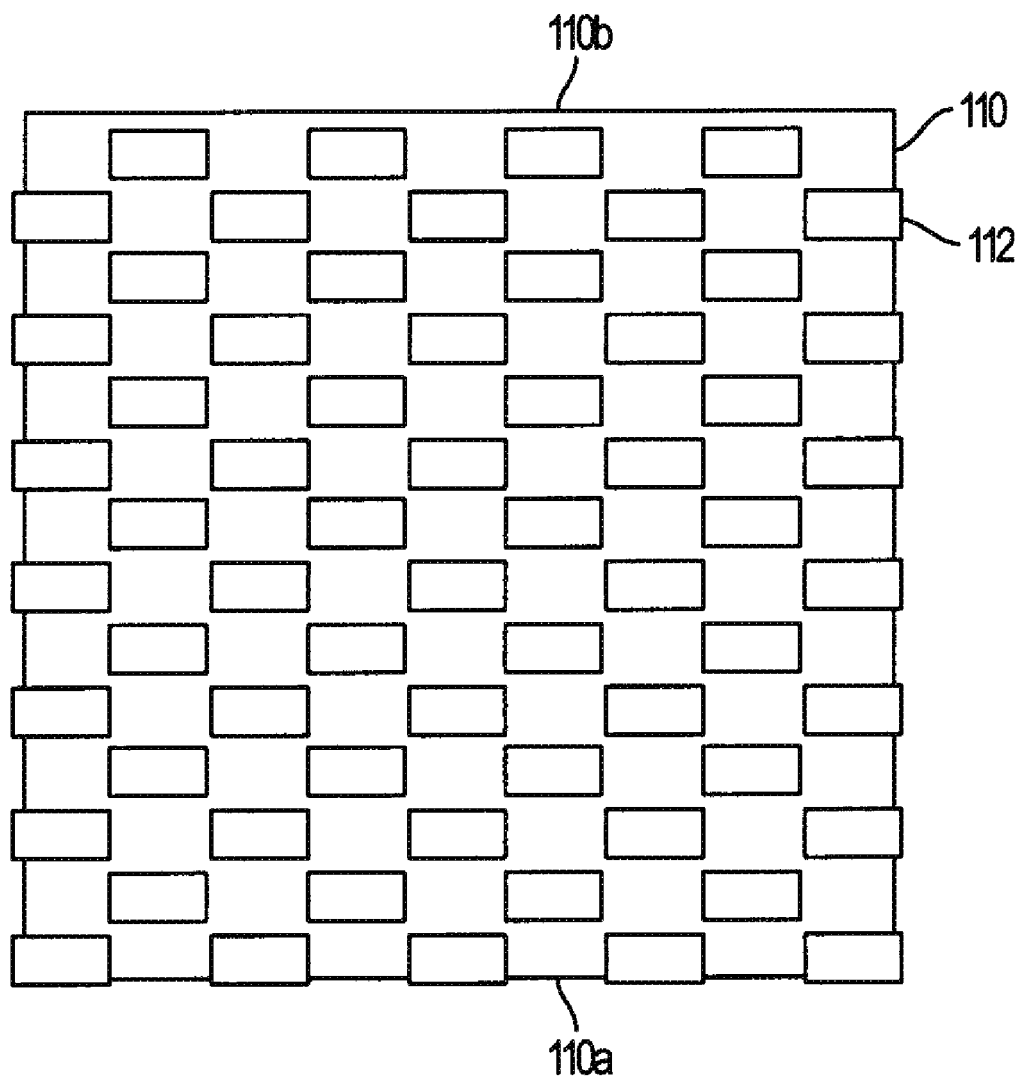

As described above, each louver element 112 within a display system extends continuously from one edge of the photovoltaic cell array 110 to another edge of the photovoltaic cell array 110 (e.g., along a direction of the first or second edge 110a or 110b). In another embodiment, however, one or more louver elements 112 may extend discontinuously from one edge of the photovoltaic cell array 110 to another edge of the photovoltaic cell array 110 (e.g., along a direction of the first or second edge 110a or 110b). For example, referring to FIG. 17C, louver elements 112 may extend discontinuously from one edge of the photovoltaic cell array 110 to another edge of the photovoltaic cell array 110 (e.g., along a direction of the first or second edge 110a or 110b). Although FIG. 17C illustrates wherein all louver elements 112 extend discontinuously from one edge of the photovoltaic cell array 110 to another edge of the photovoltaic cell array 110 (e.g., along a direction of the first or second edge 110a or 110b), it will be appreciated that one or more louver elements 112 may extend continuously from one edge of the photovoltaic cell array 110 to another edge of the photovoltaic cell array 110 (e.g., along a direction of the first or second edge 110a or 110b). Although FIG. 17C illustrates wherein all louver elements 112 as extending discontinuously from one edge of the photovoltaic cell array 110 to another edge of the photovoltaic cell array 110 to form a somewhat regular pattern of louver element segments, it will be appreciated that the pattern of louver element segments may be irregularly disposed.

It will be appreciated that several of the above-disclosed and other features and functions, or alternatives thereof, may be desirably combined into many other different systems or applications. It will also be appreciated that various presently unforeseen or unanticipated alternatives, modifications, variations, or improvements therein may be subsequently made by those skilled in the art which are also intended to be encompassed by the following claims.

What is claimed is:

1. A method of forming a solar energy converter assembly, comprising:
   providing a solar energy converter configured to convert light incident on a light-receiving surface thereof into another form of energy;
   providing support beams adjacent to the light-receiving surface; and
   providing louver elements on corresponding ones of the support beams adjacent to the light-receiving surface such that light is transmittable between the louver elements to the light-receiving surface along a plurality of directions, the louver elements having display surfaces visible along a predetermined direction different from the plurality of directions and such that non-display surfaces of the louver elements reflect light to the light-receiving surface.

2. The method of claim 1, wherein the solar energy converter includes at least one of a thermoelectric unit, a solar thermal unit, a photovoltaic cell array having one or more photovoltaic cells, or a combination thereof.

3. The method of claim 1, further comprising providing a support frame, wherein providing the louver elements comprises:
   coupling the louver elements to a support frame; and
   arranging the support frame such that the louver elements coupled thereto are adjacent to the light-receiving surface.

4. The method of claim 3, further comprising adjusting an orientation of at least one louver element relative to the support frame after coupling the at least one louver element to the support frame.

5. The method of claim 3, further comprising providing a fill material on the light-receiving surface and between the louver elements after arranging the support frame, the fill material fixing the louver elements to the light-receiving surface.

6. The method of claim 5, further comprising removing the support frame from the louver elements after providing the fill material.

7. The method of claim 1, further comprising providing a fill material adjacent to the louver elements, wherein the fill material includes a light-transmissive material.

8. The method of claim 1, wherein providing the louver elements comprises co-extruding support beams with louver elements to form multiple co-extruded pieces.

9. The method of claim 1, wherein providing the louver elements comprises:
   co-extruding a support beam with a louver element to form a single co-extruded piece; and
   dividing the single co-extruded piece into multiple co-extruded pieces.

10. The method of claim 1, wherein providing the louver elements comprises co-extruding support beams with louver elements to form a single co-extruded sheet.

11. The method of claim 1, wherein providing the louver elements comprises forming the louver elements on the light-receiving surface.

12. The method of claim 1, wherein providing the louver elements comprises:
   forming the louver elements on a work surface; and
   thereafter, arranging the louver elements on the light-receiving surface.

13. The method of claim 1, wherein providing the louver elements comprises:
   providing a material layer on the light-receiving surface, the material layer including a light-transmissive material;
   forming grooves within the material layer; and
   forming louver elements within the grooves.

14. A method of forming a solar energy converter assembly, comprising:
   providing a solar energy converter configured to convert light incident on a light-receiving surface thereof into another form of energy;
   providing louver elements adjacent to the light-receiving surface such that light is transmittable between the louver elements to the light-receiving surface along a plurality of directions, such that display surfaces visible along a predetermined direction different from the plurality of directions and such that non-display surfaces of the louver elements reflect light to the light-receiving surface;
   providing support beams;
   coupling each louver element to a support beam; and
   arranging the support beams having the louver elements coupled thereto adjacent to the light-receiving surface.

15. A method of forming a solar energy converter assembly, comprising:
   providing a solar energy converter configured to convert light incident on a light-receiving surface thereof into another form of energy; and
   providing louver elements adjacent to the light-receiving surface such that light is transmittable between the louver elements to the light-receiving surface along a plurality of directions, the louver elements having display surfaces visible along a predetermined direction different from the plurality of directions and such that non-display surfaces of the louver elements reflect light to the light-receiving surface providing a flexible film wherein providing louver elements comprises:
   coupling the louver elements to the flexible film;
   bending the flexible film having the louver elements coupled thereto; and
   arranging the flexible film adjacent to the light-receiving surface.

16. The method of claim 15, further comprising bending the flexible film before arranging the flexible film adjacent to the light-receiving surface.

17. The method of claim 15, further comprising bending the flexible film after arranging the flexible film adjacent to the light-receiving surface.

18. The method of claim 15, wherein bending the flexible film comprises:
   providing a support material having a non-planar surface; and
   providing the flexible film on the non-planar surface.

* * * * *

UNITED STATES PATENT AND TRADEMARK OFFICE
CERTIFICATE OF CORRECTION

PATENT NO.         : 8,402,653 B2                                    Page 1 of 1
APPLICATION NO.    : 12/533989
DATED              : March 26, 2013
INVENTOR(S)        : Jurgen H. Daniel and David K. Fork It is certified that error appears in the above-identified patent and that said Letters Patent is hereby corrected as shown below:

In the Specification:

Column 5, line 54, the word "213" should be replaced with --2B--.

Signed and Sealed this
Twenty-second Day of October, 2013

Teresa Stanek Rea
*Deputy Director of the United States Patent and Trademark Office*